(12) United States Patent
MacLeod et al.

(10) Patent No.: US 10,802,891 B2
(45) Date of Patent: Oct. 13, 2020

(54) APPLICATION INTERFACE GOVERNANCE PLATFORM TO HARMONIZE, VALIDATE, AND REPLICATE DATA-DRIVEN DEFINITIONS TO EXECUTE APPLICATION INTERFACE FUNCTIONALITY

(71) Applicants: Marc MacLeod, Austin, TX (US); Duane Tharp, Austin, TX (US)

(72) Inventors: Marc MacLeod, Austin, TX (US); Duane Tharp, Austin, TX (US)

(73) Assignee: Stoplight, Inc., Austin, TX (US)

( * ) Notice: Subject to any disclaimer, the term of this patent is extended or adjusted under 35 U.S.C. 154(b) by 165 days.

(21) Appl. No.: 16/174,870

(22) Filed: Oct. 30, 2018

(65) Prior Publication Data
US 2020/0133744 A1 Apr. 30, 2020

(51) Int. Cl.
| | | |
|---|---|---|
| *G06F 3/00* | (2006.01) | |
| *G06F 9/44* | (2018.01) | |
| *G06F 9/46* | (2006.01) | |
| *G06F 13/00* | (2006.01) | |
| *G06F 9/54* | (2006.01) | |
| *G06K 9/68* | (2006.01) | |
| *G06F 30/3312* | (2020.01) | |

(52) U.S. Cl.
CPC .......... *G06F 9/541* (2013.01); *G06F 30/3312* (2020.01); *G06K 9/6885* (2013.01)

(58) Field of Classification Search
CPC ...................................................... G06F 9/541
USPC ........................................................ 719/328
See application file for complete search history.

(56) References Cited

U.S. PATENT DOCUMENTS 6,178,550 B1  1/2001 Pearce
2011/0165551 A1  7/2011 Yamazaki et al.

OTHER PUBLICATIONS

Amazon API Gateway, Amazon Web Services, Inc., https://docs.aws.amazon.com/apigateway/latest/developerguide/welcome.html.
CURL, Stenberg, Daniel, https://curl.haxx.se.
OpenAPI Initiative, The Linux Foundation, https://www.openapis.org/; Published Feb. 20, 2020.
OpenAPI Specification, The Linux Foundation, https://github.com/OAI/OpenAPI-Specification.
Swagger Editor, SmartBear Software, Inc., https://swagger.io/tools/swagger-editor/.

(Continued)

*Primary Examiner* — Timothy A Mudrick
(74) *Attorney, Agent, or Firm* — Kokka & Backus, PC

(57) ABSTRACT

Various embodiments relate generally to data science and data analysis, computer software and systems, including a subset of intermediary executable instructions constituting an communication interface between various software and/or hardware platforms, and, more specifically, to an automated application interface governance platform to automate development, maintenance, and governance functions for application interfaces, such as harmonizing, validating, and/or replicating application program interfaces ("APIs"). For example, a method may include identifying a subset of application interfaces, synthesizing a data structure for each application interface, analyzing the data structure against other data structures to identify duplicative portions among multiple data structures, substituting a reference to a location into a portion of multiple application interfaces. Optionally, the method may include evaluating interoperability of multiple application interfaces to validate collective operation of a subset of application interfaces.

20 Claims, 13 Drawing Sheets

(56) References Cited

OTHER PUBLICATIONS

Troger, Peter et al., "Standardization of an API for Distributed Resource Management Systems," Seventh IEEE International Symposium on Cluster Computing and the Grid (CCGrid '07), Rio De Janeiro, 2007.
Troung, Lechi, Notice of Allowance and Fee(s) Due dated Apr. 29, 2020 for U.S. Appl. No. 16/533,748.

APPLICATION INTERFACE GOVERNANCE PLATFORM TO HARMONIZE, VALIDATE, AND REPLICATE DATA-DRIVEN DEFINITIONS TO EXECUTE APPLICATION INTERFACE FUNCTIONALITY

FIELD

Various embodiments relate generally to data science and data analysis, computer software and systems, including a subset of intermediary executable instructions constituting an communication interface between various software and/or hardware platforms, and, more specifically, to an automated application interface governance platform to automate development, maintenance, and governance functions for application interfaces, such as harmonizing, validating, and/or replicating application program interfaces ("APIs"), and the like.

BACKGROUND

Advances in computing hardware and software have facilitated decentralization of computing tasks to increasing numbers of networked service applications, servers, and repositories, which collectively (and conceptually) has become known as "the cloud" or "cloud computing." As demand for cloud-based services increases, requirements to facilitate data connectivity increases exponentially among different applications residing on different computing hardware platforms in different networks. Consequently, numerous application programming interfaces ("APIs") have are being developed to provide data-interpretive conduits through which to exchange data and instructions among disparate operating systems, applications, and computing devices. Many different approaches to create APIs have led to the creation and use of various ad hoc and non-standard APIs, most of which are generally created for specific or one-time use and not well-suited for reuse or adoption by other developers.

To encourage adoption and reuse, some conventional approaches to developing APIs include the use of a standard that provides guidance to uniformly create APIs that may be used and adopted more easily that ad hoc and non-standard APIs. However, there are drawbacks to these conventional approaches. For example, while such standards help facilitate creation of similarly-structured APIs, there exists a great variety of differently-structured APIs even when developed in accordance with known standards. As the number of API developers participating in API development increases, the difficulties of designing and managing API definitions increase exponentially. This usually is due to various complexities and inconsistencies inherently being injected into APIs regardless of API standards. Different individualistic approaches to API development for a particular API specification contribute to the complexities and inconsistencies among APIs (e.g., similarly-defined objects may be identified differently or may include different data). Current API design processes in which API definitions are created are typically manual in nature and require resources (e.g., computational and human resources) to identify and correct errors, which, in turn, increases friction between teams (or groups) of API developers and existing system components. These barriers likely result in errors arising in collaborative API development, thereby impairing deployment into commerce. Further, known approaches to using API specifications may require resources (e.g., manual resources) to recast legacy APIs to comport with up-to-date standards.

Thus, what is needed is a solution for facilitating techniques to optimize data operations applied to application programming interfaces, without the limitations of conventional techniques.

BRIEF DESCRIPTION OF THE DRAWINGS

Various embodiments or examples ("examples") of the invention are disclosed in the following detailed description and the accompanying drawings.

DETAILED DESCRIPTION

Various embodiments or examples may be implemented in numerous ways, including as a system, a process, an apparatus, a user interface, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents thereof. Numerous specific details are set forth in the following description in order to provide a thorough understanding. These details are provided for the purpose of example and the described techniques may be practiced according to the claims without some or all of these specific details. For clarity, technical material that is known in the technical fields related to the examples has not been described in detail to avoid unnecessarily obscuring the description.

Figure 1:
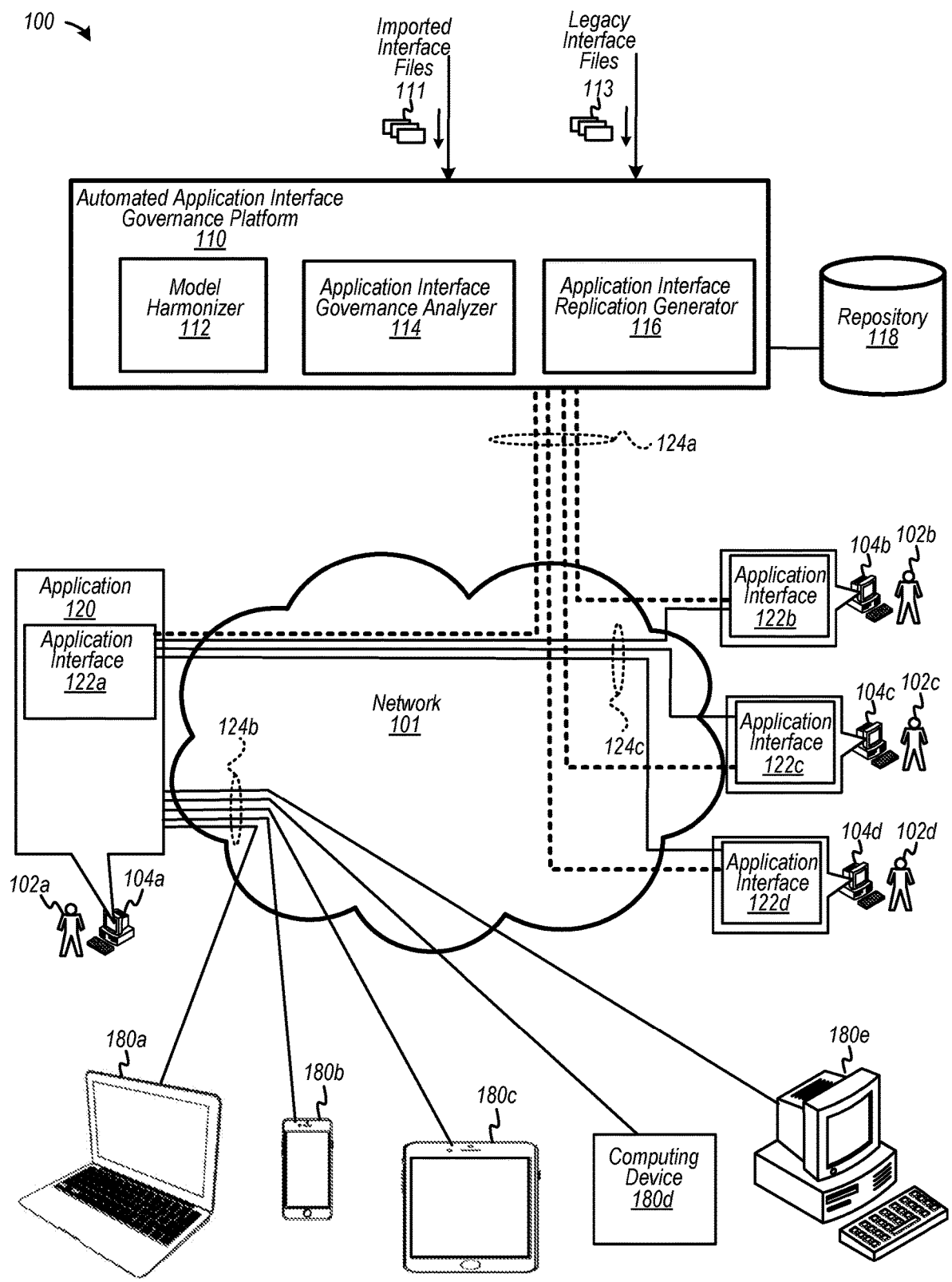
FIG. 1 is a diagram depicting an example of an automated application interface governance platform, according to at least some embodiments.

FIG. 1 is a diagram depicting an example of an automated application interface governance platform, according to at least some embodiments. Diagram 100 depicts an automated application interface governance platform 110 configured to automate development, maintenance, governance functions, among other operations, for application interfaces. Automated application interface governance platform 110 may be configured to harmonize, validate, and/or replicate application interfaces (or portions thereof), such as application program interfaces ("APIs") or the like. For example, automated application interface governance platform 110 may be configured to facilitate generation of application interfaces through development at "design time" in which an application interface may be "harmonized" with one or more other application interfaces. Automated application interface governance platform 110 further may be configured to analyze performance of an application interface, such as a harmonized application interface, at design time. Analyzation and validation may be performed statically or through simulation, for example, prior to "run time" analysis or released implementation. During run time, automated application interface governance platform 110 may be configured to analyze exchanges of data among a system of application interfaces to monitor and validate performance, as well as to replicate or derive application interface definitions for legacy application interfaces. The above-described functionalities of automated application interface governance platform 110 may be implemented in the various structures and/or functions set forth in accordance with various embodiments described herein. Further, application interface governance platform 110, and any portion thereof, may be implemented in either in hardware or software, or a combination thereof.

As shown in diagram 100, automated application interface governance platform 110 may be configured to communicate via one or more networks 101 to facilitate development, testing, release, and maintenance, among other things, of any number of application interfaces 122a, 122b, 122c, and 122d, as well as any other additional applications interfaces, which are not shown. An application interface, according to some examples, may be implemented as an application program interface ("API"), which may be a set of programming instructions formed to specify interoperability of one or more software components, any of which may be different applications that perform on different operating systems and different hardware platforms (e.g., different processors and accompanying circuitry). The one or more software components may be disposed locally or remotely relative to an application implementing an API. According to some examples, programmatic data representing any of application interfaces 122a, 122b, 122c, and 122d may include an API and/or a software connector.

An application interface, such as an API, may include data representing any number of objects and properties, and may be created as application interface definitions formatted in an application interface description language in accordance, for example, with an application interface specification. An API description language may facilitate generation of a machine-readable description of the functionalities of an API as an API definition file. An API definition file may include data configured to drive execution or performance of any number of electronic or software-based processes and methods at a referent network location (e.g., a target network location, such as an endpoint, to which a reference points). In some cases, an API definition file may also include human-readable text. Hence, an API definition may include data that defines operation of one or more hardware or software processes, and, thus, may be equivalent to source code for a set of executable instructions.

An API definition may be written or otherwise formulated in accordance with one or more API specifications. In some cases, an API definition may be formed as a free-form text document. Or, the API definition may be created to comply with one or more application interface specifications. For example, an API definition may be formed to comply with the OpenAPI specification, which defines creation of a specific API definition in a machine-readable format. The OpenAPI specification is maintained by the OpenAPI Initiative™ at openapis(dot)org, which is part of the Linux Foundation®, and had been originally developed as "Swagger" by SmartBear Software™ at smartbear(dot)com. An API definition may be formed in other description languages, such as RESTful API Modeling Language ("RAML") at raml(dot)org, which is developed by Mulesoft, Inc®. or using API Blueprint™ definition language at apiblueprint(dot)org, which had been developed by Apiary, Inc., and acquired by Oracle®, Inc. Other examples of description languages for creating an application interface include Web Services Description Language ("WSDL"), Web Application Description Language ("WADL"), and the like. According to some examples, the term "application interface" may be interchangeable with the term "API," without limitation to a specific service, protocol, application, etc., and thus is not limited to RESTful architectural implementations.

In some examples, an API definition may describe operations that may be implemented by a business process (e.g., a method or process performed for or on behalf of an entity and its data-driven processes). Such operations may consume inputs, such as data and business objects that support a business process. For example, consider a "customer" object is derived to support a computerized business process, whereby the customer business object may include fields to define attributes, properties, values, etc., for the customer business object. Operations or functions of a business object may be performed using inputs to contextualize the operation and change a state of a business (e.g., placing an order for a specific customer), or report on a state of a business or entity. Further, the operations performed by a business object may generate output data that may also include data representing one or more business objects.

In the example shown, each of application interfaces 122a, 122b, 122c, 122d may provide one or more individual services that collectively perform a comprehensive service. For example, computing device 104a may be configured by a user 102a to generate and host an application 120 to facilitate a comprehensive service that provides for on-line product offerings, ordering, and shipping of a purchased product from a third party seller and/or shipper. Application 120, as a service endpoint, may receive electronic requests via data channels 124b in network 101 from any of client devices 180a, 180b, 180c, 180d, and 180e, among any other type of client device. Thus, customers or users associated with client devices 180a to 180e may purchase products on-line through electronic interactions with application 120, which, in turn, implements application interface 122a to interoperate with application interfaces 122b, 122c, and 122d. Note that in some embodiments, the term "service" may refer, at least in one example, to one or more data-driven or application-driven functions (or computer-implemented operations) at one or more endpoints of one or more networked data channels, such as data channels 124b and 124c. A service endpoint may be data-driven API resource, process, or method, and may be identified as a uniform resource location ("URL"), a uniform resource identifier ("URI"), or the like.

Application 120 may include one or more application interfaces to access independent services, methods, processes, or resources (e.g., as endpoints). Functionality of application 120 may be based on individual services, any of which may or may not be associated with an entity or organization of which user 102a is a member. Users 102a, 102b, 102c and 102d each may be a member of an entity, such as a corporation, and each may develop different application interfaces 122a, 122b, 122c, and 122d, respectively, at different geographic locations.

Further to the above example, user 102b may develop application interface 122b via computing device 104b to create, update, and manage data representing customer-related information, such as a customer first name, a customer last name, an address, telephone number, payment information (e.g., credit card numbers, bank routing numbers, etc.), and the like. User 102c may develop application interface 122c via computing device 104c to create, update, and manage data representing payment-related information and functions, such as identifying a method of payment, acquiring authorization, executing payment transactions, encrypting and securing sensitive data, and confirming payment, among other information. User 102d may develop application interface 122d via computing device 104d to create, update, and manage data representing shipment-related information and functions, such as identifying an ordered product, confirming inventory of the ordered product, and coordinating shipment via a carrier to a customer, and the like. In view of application interfaces 122b, 122c, and 122d, user 102a may develop application interface 122a via computing device 104a to create, update, and manage data representing order-related information and functions. Specifically, application interface 122a can generate requests and receive responses via data channels 124c in network 101 with (1.) application interface 122b to determine customer information via a customer information service, (2.) application interface 122c to effect payment via a payment service, and (3.) application interface 122d to ship an ordered product via a shipment service. Note that any of application interfaces 122b, 122c, and 122d may communicate directly with each other or any other application interface via data channels (not shown).

Each of application interfaces 122a, 122b, 122c, and 122d may be developed via a user interface ("UI") at respective computing devices 104a, 104b, 104c and 104d using, for example, one or more applications, such as computerized API development tools, to facilitate generation of API definitions (e.g., via a visual API design editor or text editor) that may include either machine-readable data or human-readable data, or both, in accordance to one or more API specifications. The one or more applications may also include logic to debug, validate, and monitor interoperability among application interfaces 122a, 122b, 122c, and 122d at design time (e.g., during code and API definition development, or pre-production, using a mock server, etc.) and/or at run time (e.g., released into production). Note that the one or more applications constituting computerized API development tools may be either disposed (e.g., downloaded into memory) at any of computing devices 104a, 104b, 104c and 104d or disposed at automated application interface governance platform 110, or a combination thereof. Further, one or more application interfaces 122a, 122b, 122c, and 122d may reside (e.g., hosted), during design time and/or run time, at any of computing devices 104a, 104b, 104c and 104d, or at automated application interface governance platform 110, or a combination thereof. Thus, data representing an API definition may be stored as one or more computer files in memory at any of computing devices 104a, 104b, 104c and 104d, or stored in a repository 118 of automated application interface governance platform 110.

The above-described system of application interfaces 122a, 122b, 122c, and 122d is an example of a system of application interfaces. Note, however, that as the number of application interfaces increases to enhance performance or functionality of an application 120, a number of application interfaces may increase into numeric ranges in the dozens or hundreds, or greater. Some of the application interfaces may be developed, designed, and maintain by many different teams or entities at the same or different geographic locations. Further, each API definition for the many application interfaces may be modified differently at various times to adapt to unique changes to processes of a business or an entity. And the changing demands of a business or entity may initiate changes in API processes at a corresponding rate. In view of the environment in which application interfaces may be developed and implemented, automated application interface governance platform 110 may be configured to reduce or negate potential errors in interoperability of a system of application interfaces. For example, automated application interface governance platform 110 may be configured to identify opportunities to increase reuse of application interfaces, decrease duplication of artifacts and/or application interfaces, increase consistency and alignment with organizational and industry API design best practices, among other things.

As shown, automated application interface governance platform 110 may include a model harmonizer 112, an application interface governance analyzer 114, and an application interface replication generator 116, according to at least some examples. Model harmonizer 112 may be configured to detect and align consistencies among subsets of application interfaces, and to detect and model patterns among the subsets of application interface. By resolving inconsistencies and detecting duplicate patterns as candidates for replacement by a model, model harmonizer 112 may be configured to "harmonize" various application interfaces (e.g., harmonizing or standardizing one or more portions of application interfaces, or conforming such portions of application interfaces to a consistent structure or model). Thus, model harmonizer 112 may be configured to analyze application interface definitions (e.g., API definitions) stored in, for example, repository 118 and at any of computing devices 104a, 104b, 104c and 104d, as well as imported application interface files 111, legacy application interface files 113, and any other application interface file. An imported application interface file 111 may include one or more API definition files that may be formatted with the same or different API specifications than, for example, application interfaces 122a, 122b, 122c, and 122d. In some cases, imported application interface files 111 may originate from developers other than developers 102a, 102b, 102c and 102d. A legacy application interface file 113 may include an application interface definition (e.g., API definition) that may be formed irrespective of one or more application interface specifications (e.g., API specifications) and may be created, for example, in free-form text, and may not comply with standardized formats (e.g., in accordance with the OpenAPI Specification, or the like).

Model harmonizer 112 may be configured to subsequently detect patterns among multiple application interfaces as opportunities to identify and harmonize, for example, similar or equivalent terms or terminology describing objects, properties, values, etc. For example, model harmonizer 112 may analyze a system of application interfaces, such as application interfaces 122a, 122b, 122c, and 122d, or any other application interface, to identify portions that may be modified to form a consistent portion (e.g., consistent set of objects and properties), which may be substituted or replaced by a reference. As another example, model harmonizer 112 may be configured to detect similarly-patterned portions of the application interfaces that may represent a duplicate property, a duplicate object, and/or a duplicate operation, any of which may be harmonized as a specific portion of an application interface. Therefore, a harmonized portion of an API may be established as a model that may be substituted or replaced by a reference to the model.

In at least one example, model harmonizer 112 may be configured to synthesize a data structure for each application interface. A synthesized data structure may be constructed for comparison against other data structures association with other application interfaces. Based on the synthesized data structures, model harmonizer 112 may be configured to analyze a data structure against other synthesized data structures derived from other application interfaces to identify duplicative (or substantially duplicative) constituent portions among multiple data structures. Model harmonizer 112 may be configured to detect a portion of one or more application interfaces associated with a duplicative constituent portion that, for example, may be a similar or equivalent pattern to others portions in other application interfaces. Thus, model harmonizer 112 may detect similar or equivalent patterns, at least in some examples, based on similar or equivalent patterns of attributes, properties, values, objects, models, terms or textual description, etc., as well as structures and structural relationships thereof. In some cases, a candidate duplicative portion may be referred, at least in some examples, as a candidate duplicate pattern of data. Matched patterns of portions of application interfaces may be identified as duplicative constituent portions that may form the basis of a model, which may be formed to substitute or replace an original portion of an application interface. In some examples, a match patterned portion may form a model that may be substituted with a reference to the model or application interface portion. The model may be inserted into a common application interface or in an independent file, which may be usable by other developers. A reference may be used to replace a matched pattern in an API to a reference a location at which a model may be accessed or extracted.

Application interface governance analyzer 114 may be configured to evaluate interoperability of application interfaces 122a to 122d, among others, to validate collective operation of the subset of application interfaces as a system of application interfaces (e.g., a system of APIs). Application interface governance analyzer 114 may be configured to perform to computations to determine whether interoperability between two or more application interfaces are within expected tolerances or ranges of valid operation (e.g., in view of one or more thresholds or one or more threshold ranges of values). In some examples, determining acceptable interoperability between two or more application interfaces may include analyzing an application interface (e.g., a harmonized application interface) that might include a reference to a duplicative constituent portion or pattern relevant to a subset of application interfaces (e.g., a patterned portion of an application interface that may be duplicative over multiple application interfaces). In some other examples, determining acceptable interoperability between two or more application interfaces may include analyzing a replicated application interface derived from, for example, a legacy API, as transformed by application interface replication generator 116.

According to some examples, application interface governance analyzer 114 may be configured to analyze, statically, any of application interfaces 122a, 122b, 122c, and 122d in a system of application interfaces. A static analysis may be performed at design time (e.g., as code is being developed or refined), which may be prior to executing code at run time. Design time may be a phase of API definition development prior to executing code at run time. In one example of static analysis performed at design time, application interface governance analyzer 114 may identify one or more applicable API definitions and associated API specifications in a system of APIs. Further, application interface governance analyzer 114 may be configured to automatically perform static analysis of an API definition against an API specification to validate, for example, syntax and semantic compliance, among other requirements or standardized data formats for an API specification (e.g., static analysis may be implemented automatically to validate against, for example, an OpenAPI specification).

According to some examples, application interface governance analyzer 114 may be configured to perform a simulation to analyze, dynamically, any of application interfaces 122a, 122b, 122c, and 122d to validate operation in a system of application interfaces. In a simulation, application interface governance analyzer 114 may be configured to analyze execution of a program implementing an API definition-under-test to, for example, detect when a reference is invoked. The reference may be a pointer configured to point to an API element (e.g., a model, a resource, etc.) defined in a different portion of the same or different API definition file or network location to be dereferenced. Application interface governance analyzer 114 may implement a simulator application (not shown) that may operate as a proxy to retrieve referenced remote content at a referent API, as well as log or store data representing requests and corresponding responses. Therefore, a simulation application may transmit a retrieved response (e.g., a simulated response including remote content) to the requesting program or application (associated with the requesting API definition-under-test) in a transparent manner to validate interoperability of APIs dynamically, for example.

According to various additional examples, application interface governance analyzer 114 may be configured to analyze, at "run time," any of application interfaces 122a, 122b, 122c, and 122d to validate operation in a system of application interfaces. During run time, application interface governance analyzer 114 may be configured to determine dependencies between an API and other APIs via, for example, an API topological graph and database of API definition and descriptions. To determine validity, API descriptions and patterned data may be derive from valid request-response operations developed and captured at "design time." Thus, the API descriptions may be used to affirm valid operation at "run time," or to surface anomalies or errors (e.g., if one or more API definitions are out of synch with a service being called).

Application interface replication generator 116 may be configured to detect and identify legacy application interfaces, as well as request-response services and data exchanged therewith. Application interface replication generator 116 may be further configured to generate a replication of a legacy API based on monitored data traffic, whereby the replicated API may be configured to conform to at least one API specification or standard. In some cases, a legacy application interface may be originally developed independent of an API specification or standard, and may be deployed continually so as not to expend resources to manually adapt a legacy application interface. Thus, application interface replication generator 116 may be configured to convert a legacy API into an API definition that complies with an API standard or specification, such as the OpenAPI specification, thereby preserving resources that otherwise may be consumed to manually convert legacy APIs into standardized API specifications.

Figure 2:
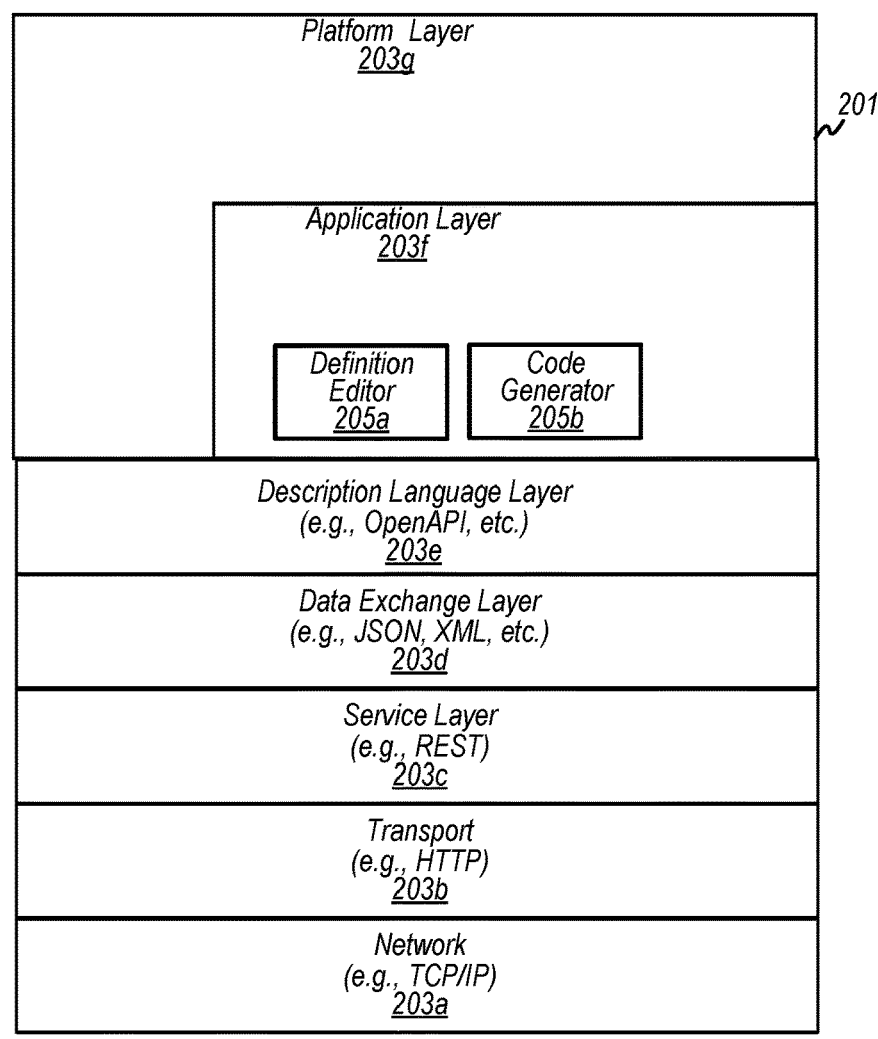
FIG. 2 illustrates an exemplary layered architecture for implementing an automated application interface governance platform, according to some examples.

FIG. 2 illustrates an exemplary layered architecture for implementing an automated application interface governance platform, according to some examples. Diagram 200 depicts application stack ("stack") 201, which is neither a comprehensive nor fully inclusive layered architecture for developing an application or platform for automating development, maintenance, governance functions, among other operations, for application interfaces, including APIs. In the example shown, stack 201 includes a platform layer 203g, which may include one or more applications, frameworks, platforms, and the like to support operability of an automated application interface governance platform and its constituent components and processes, including a model harmonizer, an application interface governance analyzer, and an application interface replication generator. Further, stack 201 depicts platform layer 203g on an application layer 203f, which may be configured to generate application interface definitions (e.g., API definitions).

Application layer 203f may include a definition editor 205a and a code generator 205b, either of which may be disposed locally on a computing device or hosted remotely at a platform server. Definition editor 205a may be an application configured to generate a user interface to facilitate entry of various inputs structured to populate an application interface specification, such as the OpenAPI specification, with data to create an application interface definition (e.g., an API definition). In some cases, definition editor 205a may present an API editor in a WYSIWYG-like user interface to generate operations (e.g., requests and responses relative to endpoints), models, and references to models, among other this. Examples of definition editor 205a include StopLight Design Module or Stoplight API Designer of Stoplight, Inc., Austin, Tex., U.S.A. Code generator 205b may be configured to generate API definitions in any specification-compliant format, such as JSON, YAML, XML, etc., which may be compliant with OpenAPI specifications. Further, code generator 205b may be configured to generate responses and requests in a variety of programming languages and formats, including cURL (created by Daniel Stenberg of Sweden and is maintained at curl(dot)haxx(dot) se), Python, JavaScript, Java, PHP, etc. Platform layer 203g and application layer 203f may be coded using, for example, Java®, JavaScript®, Ruby (e.g., Ruby on Rails), CSS, C+, C++, C #, C, Python™, Microsoft® .NET, PHP, Node.js, or any other structured or unstructured programming language, or any combination thereof.

Platform layer 203g and/or application layer 203f may be operably disposed on a description language layer 203e, which is a programming or structured description language to form application interface definitions in accordance with an API specification, such as the OpenAPI specification or other of the aforementioned API specification or definitions (e.g., RAML, etc.). Description language layer 203e may be disposed on Data Exchange Layer 203d, which may include any programming language, such as HTML, JSON, XML, etc., or any other format to effect generation and communication of requests and responses. Data Exchange Layer 203d may be disposed on a Service Layer 203c, which provides a transfer protocol or architecture for exchanging data among networked applications. For example, Service Layer 203c may provide for RESTful-compliant architectural and web services to facilitate GET, PUT, POST, DELETE, and PATCH methods or operations. In other examples, Service Layer 203c may provide for SOAP web services based on, for example, remote procedure calls ("RPCs"), or any other like services or protocols. Service Layer 203c may be disposed on a Transport Layer 203b, which may include protocols to provide host-to-host communications for applications via an HTTP or HTTPS protocol, in at least this example. Transport Layer 203b may be disposed on a Network Layer 203a, which, in at least this example, may include TCP/IP protocols and the like.

Figure 3:
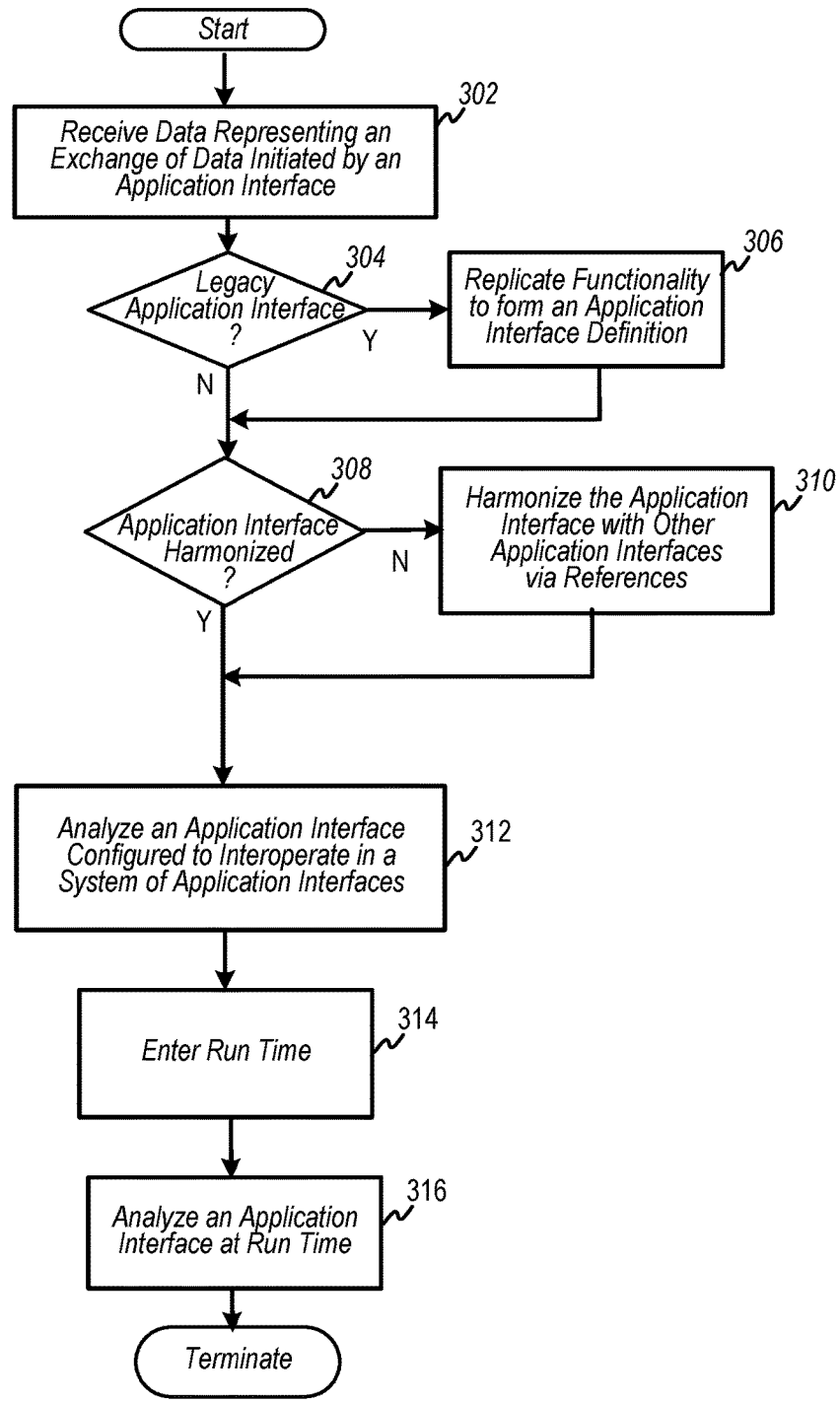
FIG. 3 is a flow diagram depicting an example operational flow of one or more constituent components of an automated application interface governance platform, according to some examples.

FIG. 3 is a flow diagram depicting an example operational flow of one or more constituent components of an automated application interface governance platform, according to some examples. At 302, data representing transmitted data (e.g., an exchange of data) may be monitored or received into one or more constituent components of automated application interface governance platform, whereby the exchange of data may be initiated or otherwise associated with operation of an application interface ("API"). An exchange of data may bidirectional (or unidirectional) in nature, and may be initiated in response to a generated request by an originating (or referring) API to a resource, endpoint, operation, etc., of a referent API (e.g., an API to which a reference points). Or, the exchange of data may be initiated by a generated response from a resource, endpoint, operation, etc., of another API. At 304, a determination is made as to whether the received data is associated with a subset of API specifications and definitions, or whether the received data is associated with a legacy application interface for which an API specification may not be relevant. If a stream of data is determined to be part of a legacy application interface, flow 300 continues to 306, at which functionality associated with the received data may be transformed from exchanges of request data and response data into a structured data description constituting an application interface definition compliant with an identified API specification (e.g., OpenAPI Specification). Thus, functionality of exchanged data may be replicated to form a replicated API having an API definition compliant with an API specification.

However, if the stream of data is determined to be relevant to an API specification, flow 300 moves to 308, at which a determination is made as to whether an application interface is harmonized. According to some embodiments, a "harmonized" application interface may refer, for example, to an application interface (e.g., an API) that may be analyzed to determine one or more portions and/or functionalities are similar or equivalent to portions and/or functionalities of other application interfaces (e.g., other APIs), whereby the similar or equivalent portions and/or functionalities may be identified as "duplicates" consistent with each other. Further, similar or equivalent portions and/or functionalities may be transmuted into a model or schema to which a reference may point. In some cases, a harmonized API includes a portion and/or a functionality that may be replaced or substituted by a reference into an API definition, whereby the reference may point to a harmonized model or schema.

If, at 308, a determination indicates an application interface is not harmonized, then flow 300 moves to 310, at which the application interface may be harmonized with other application interfaces. In some examples, portions and/or functionalities of the application interface may be harmonized with that of other application interfaces, and may include a reference to harmonized API definition portions. If, at 308, a determination indicates an application interface is harmonized, then flow 300 moves to 312. At 312, an application interface interoperating or otherwise exchanging data with other application interfaces may be analyzed statically and/or dynamically at design time to validate operation. At 314, flow 300 indicates that an automated application interface governance platform may enable an application interface to enter run time (e.g., released into beta testing or production). At 316, an application interface may be monitored and otherwise analyzed at run time to, among other things, monitor valid requests in response data and detect a deviation in a response due to, for example, modified operation of a referent API.

Figure 4:
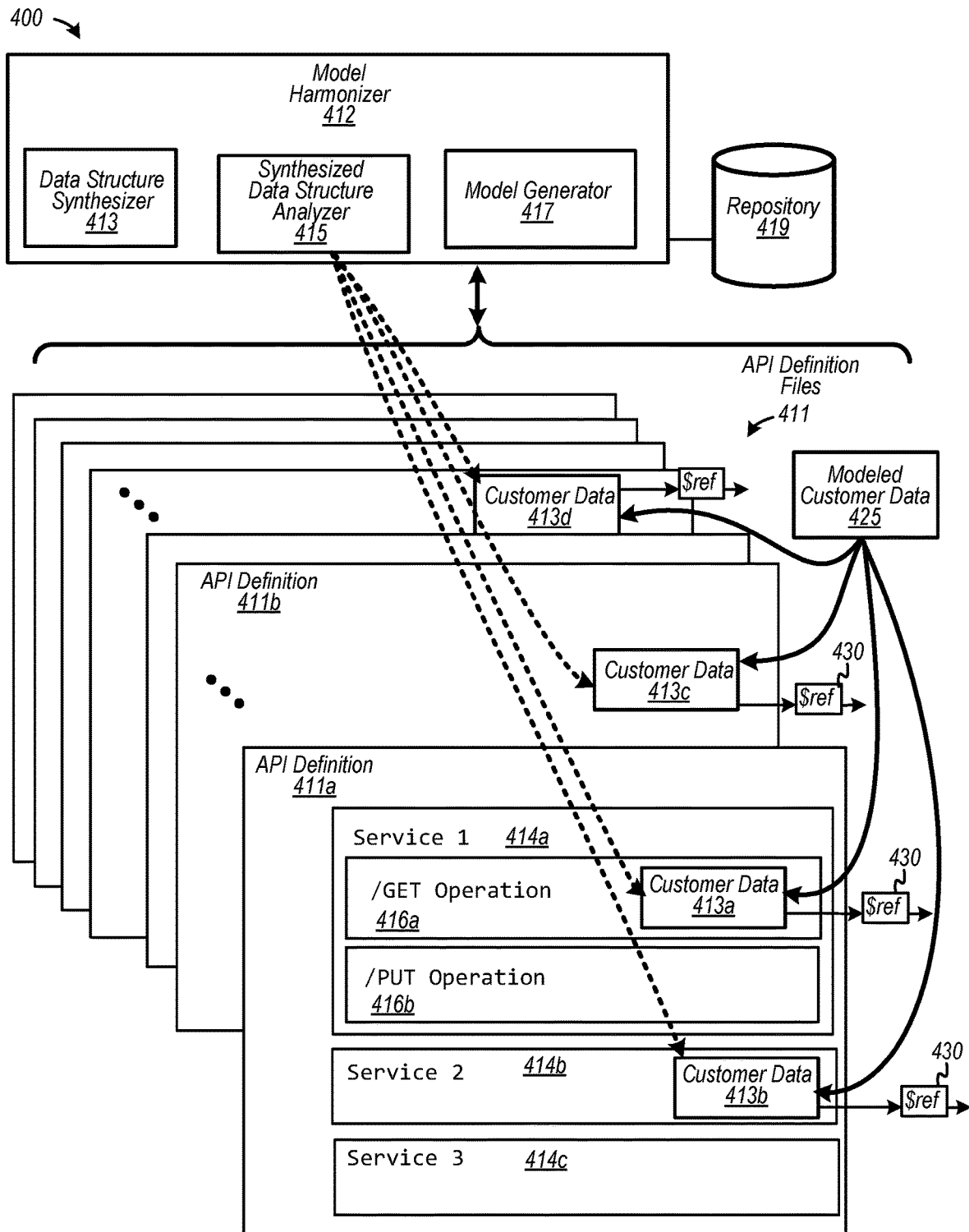
FIG. 4 is a diagram depicting a model harmonizer configured to harmonize one or more application interface definitions, according to some examples.

FIG. 4 is a diagram depicting a model harmonizer configured to harmonize one or more application interface definitions, according to some examples. Diagram 400 depicts a model harmonizer 412 configured to detect and align consistencies among subsets of application interface definitions 411, such as application definitions 411a and 411b. By detecting patterns as duplicates and/or resolving inconsistencies, model harmonizer 412 may "harmonize" various application interfaces (e.g., harmonizing or standardizing one or more portions of application interfaces, or making such portions of application interfaces consistent). Further, model harmonizer 412 may be configured to detect and model patterns of data among one or more application interfaces.

Diagram 400 depicts model harmonizer 412 including a data structure synthesizer 413, a synthesized data structure analyzer 415, and a model generator 417, one or more of which may be coupled to a repository 419 includes a data structure constituting a data dictionary describing various API definition elements (and corresponding relationships) in accordance with at least one or more API specifications. Examples of API definition elements include objects, properties, values, models, references, schemas, etc. In diagram 400, a subset of API definition files 411 may be analyzed to determine whether one or more portions can be harmonized. An example API definition is depicted as API definition 411a, which is depicted as including data and/or executable instructions to execute or perform multiple operations, methods, processes, and the like. An individual service, operation, method, or process may be directed to a higher-level service, such as service ("service 1") 414a, which may perform a number of operations 416 for service 414a.

As shown, service 414a may include data representing one or more operations, such as a "/GET" operation 416a and a "/PUT" operation 416b, among other operations, objects, properties, models, and the like. An API definition, such as API definition 411a, may include other services, such as service ("service 2") 414b, service ("service 3") 414c, and other services (not shown), each of which may perform a subset of methods, processes, or operations, including requests (e.g., request objects) and responses (e.g., as response objects). As an example, service 414a may be configured to identify products for purchase via an API that performs operations 416a and 416b (e.g., via "/paths" objects), whereas service 414b may include operations to perform payment-relations operations and service 414c may be configured to initiate operations to effect shipment-related operations to ship a product for which payment is confirmed.

Data structure synthesizer 413 may be configured to analyze an API definition, such as API definition 411a to synthesize a data structure representing structural portions and functional portions of an API definition, whereby the data structure may be implemented as a graph (e.g., a tree data structure or any other data structure). For example, data structure synthesizer 413 may be configured to transform API definition 411a into a tree-like graph having a hierarchical data arrangement consistent with an API specification, such as the OpenAPI specification. As such, data structure synthesizer 413 may be configured to determine and analyze root objects and sub-objects, properties, models, etc., for a schema (e.g., a hierarchical schema) set forth in either version 2.0 or version 3.0 (or any other versions) of an OpenAPI specification. Examples of root objects types include an "info" object directed to general information about an API (including title, version, licensing information, etc.), an array of one or more "server" objects including one or more URLs to one or more host servers, one or more "paths" objects including one or more relative paths to individual endpoints, resources, referent APIs, etc., to generate requests and receive responses, one or more "components" objects that may include one or more reusable objects for various functions compliant with the OpenAPI specification, a "security" scheme object that may configured to define a security scheme for use by an operation (e.g., OAuth2, etc.,), and any other compliant object or property. Therefore, data structure synthesizer 413 may generate a synthesized data structure that identifies a first subset of objects (and/or properties) as nodes in a first hierarchical level, with subsequent subsets of sub-objects (and/or properties) as other nodes in a second (and lower) hierarchical levels of structural and functional relationships.

Synthesized data structure analyzer 415 may be configured to analyze a synthesized data structure to identify a pattern of structured data in an API definition, such as API definition 411a. Consider that, at least in this example, synthesize data structure analyzer 415 may be configured to identify a portion of API definition 411a that may include a specific pattern of objects (e.g., object types, or types of objects per an API specification) and properties (e.g., property types, or types of properties per the API specification). For example, synthesized data structure analyzer 415 may be configured to detect a specific pattern of objects and properties, which may constitute a portion of an API definition directed to performing operations or executing instructions relating to customer data, such as data included in customer data 413a. An example of customer data 413a may be similar or equivalent to customer (or user) data included in a user information model set forth in FIG. 6, whereby model 603 may be derived from at least customer data 413a.

Referring back to FIG. 4, synthesized data structure analyzer 415 may be further configured to compare a detected pattern of data against another data structure patterns internal or external to an API definition. Synthesized data structure analyzer 415 may be configured to determine a match between a first pattern, such as a pattern constituting customer data 413a, and any other patterns that forms a match, whereby the resulting patterns may be referred to as a matched pattern. In this example, synthesized data structure analyzer 415 may determine another pattern of data internal to API definition 411a matches customer data 413a, thereby identifying customer data 413b as duplicate data. Similarly, synthesized data structure analyzer 415 may analyze portions of data in other API definitions, such as API definition 411b, to detect other patterns of data that may match customer data 413a. For example, customer data 413c and customer data 413d may match customer data 413a as duplicate data. To form or supplement a data dictionary in repository 419, synthesized data structure analyzer 415 may be configured to map graph nodes in a synthesized data structure (of a matched pattern) to a duplicate portion of an API, which, in this case, is associated with customer data 413a. Also, synthesized data structure analyzer 415 may be configured to map graph nodes of a second synthesized data structure, such as related to customer data 413b, 413c, or 413d, to the duplicate portion of the API, whereby patterns of at least one portion of the first and second synthesized data structure may be similar or equivalent.

Model generator 417 may be configured to identify duplicative portions of API definitions, such as data representing customer data 413a to 413d, and derive a schema or otherwise generate a model 425 for that portion of one or more API definitions. According to some embodiments, model generator 417 may form modeled customer data 425 as a model or schema for duplicative or common (e.g., a substantially duplicative or substantially common) portion of an API definition 411a that may be reusable in other API definitions, thereby reducing duplication of effort that otherwise may be needed to create similar API definitions. In turn, reduction of duplicative efforts may enhance efficiency. To reuse modeled data 425, model generator 417 may be configured to generate reference data ("$ref") 430 to point to modeled customer data 425, which may be inserted into API definition 411a at a location other than at which reference 430 replaces the original customer data portion. Or, model data 425 may be stored in a file location elsewhere in memory or repository 419. Hence, modeled data 425 may be used consistently to supplement API definitions, and in lieu of customer data 413a to 413d. Note that in the above-examples, which are non-limiting, FIG. 4 depicts model harmonizer 412 operating relative to customer data. However, model harmonizer 412 may operate on any type of data or any kind of data (and is not intended to be limited to customer data), according to various embodiments.

Figure 5:
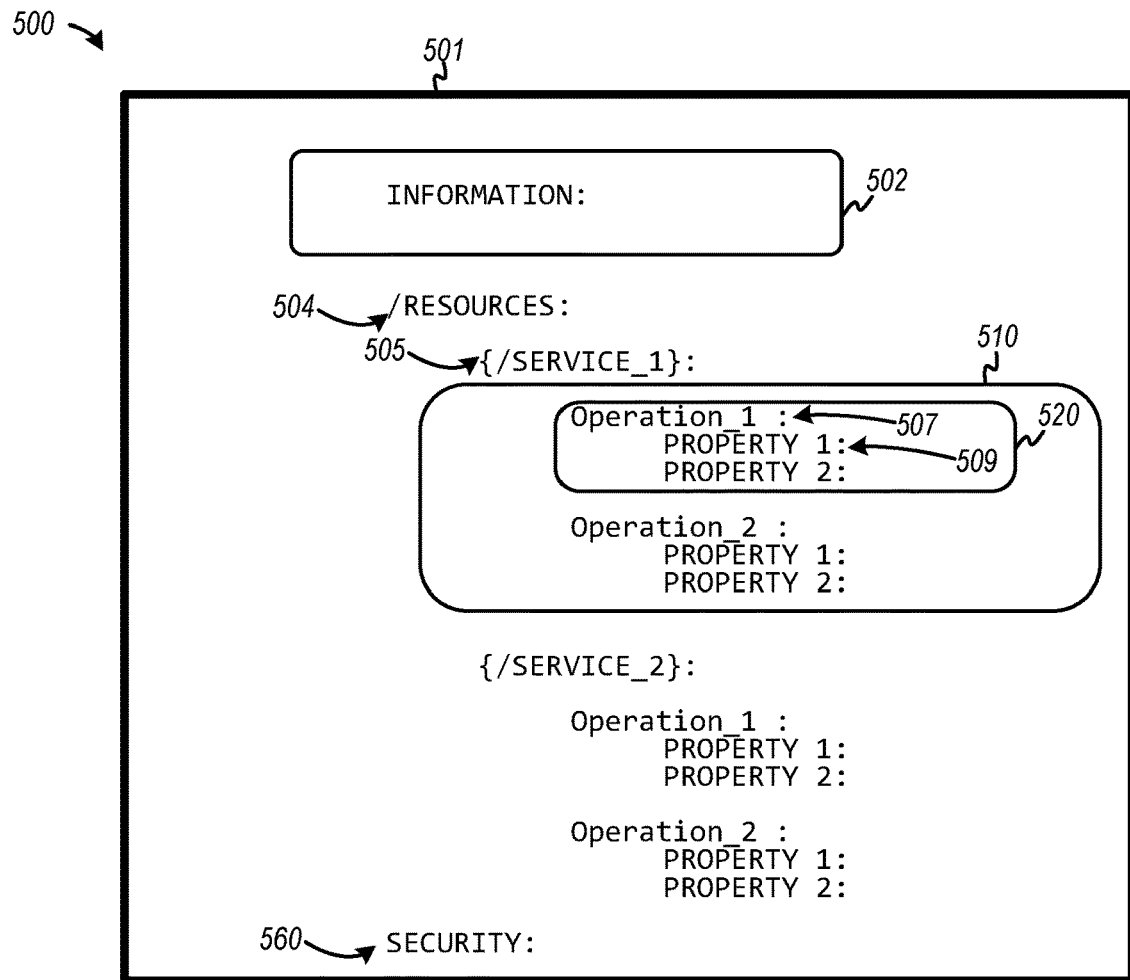
FIG. 5 is a diagram depicting an example of a portion of an API definition including example objects and properties, according to some examples.

FIG. 5 is a diagram depicting an example of a portion of an API definition including example objects and properties, according to some examples. Diagram 500 depicts an example of an API definition 501 including a number of objects, such as an information object 502 (e.g., an "info" object) as set forth in an OpenAPI specification (e.g., version 3.0), one or more resource objects 504, a security object 560, and the like. Resource object 504 may include a subset of services 505 relating to a certain concept, such as services to identify a product for sale, entering a product for sale, deleting a product for sale, searching for a product for sale, ordering a product, and the like, any of which may be performed by one or more operations. In some examples, resources 504 may be a "/path" object in accordance with OpenAPI specification (e.g., version 3.0). Further, a service 505 may include a number of operations 510, including at least a first operation ("Operation_1") 520 having any number of properties, such as property ("Property_1") 509. Operation 520 may include a RESTful operation and/or method, such as any of GET, POST, PUT, and DELETE operations.

Figure 6:
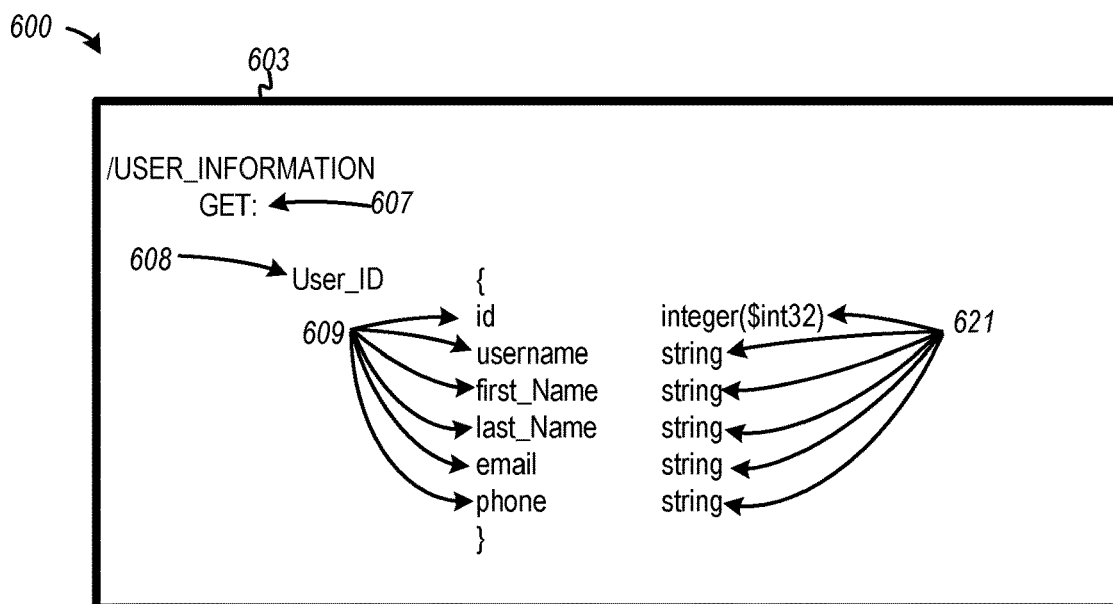
FIG. 6 is a diagram depicting an example of a model generated by a model generator, according to some examples.

FIG. 6 is a diagram depicting an example of a model generated by a model generator, according to some examples. Diagram 600 depicts a model 603 associated with a call to a target resource, endpoint, or method to retrieve user information via, for example, a "/GET" operation 607. Model 603 may be an object referred to as a "user identifier" ("User_ID") 608, which may include a number of properties 609 and associated values, data types, configuration data, or any other descriptive metadata. In some examples, model 603 may be formed in JSON, YAML, XML, or any other format.

Figure 7:
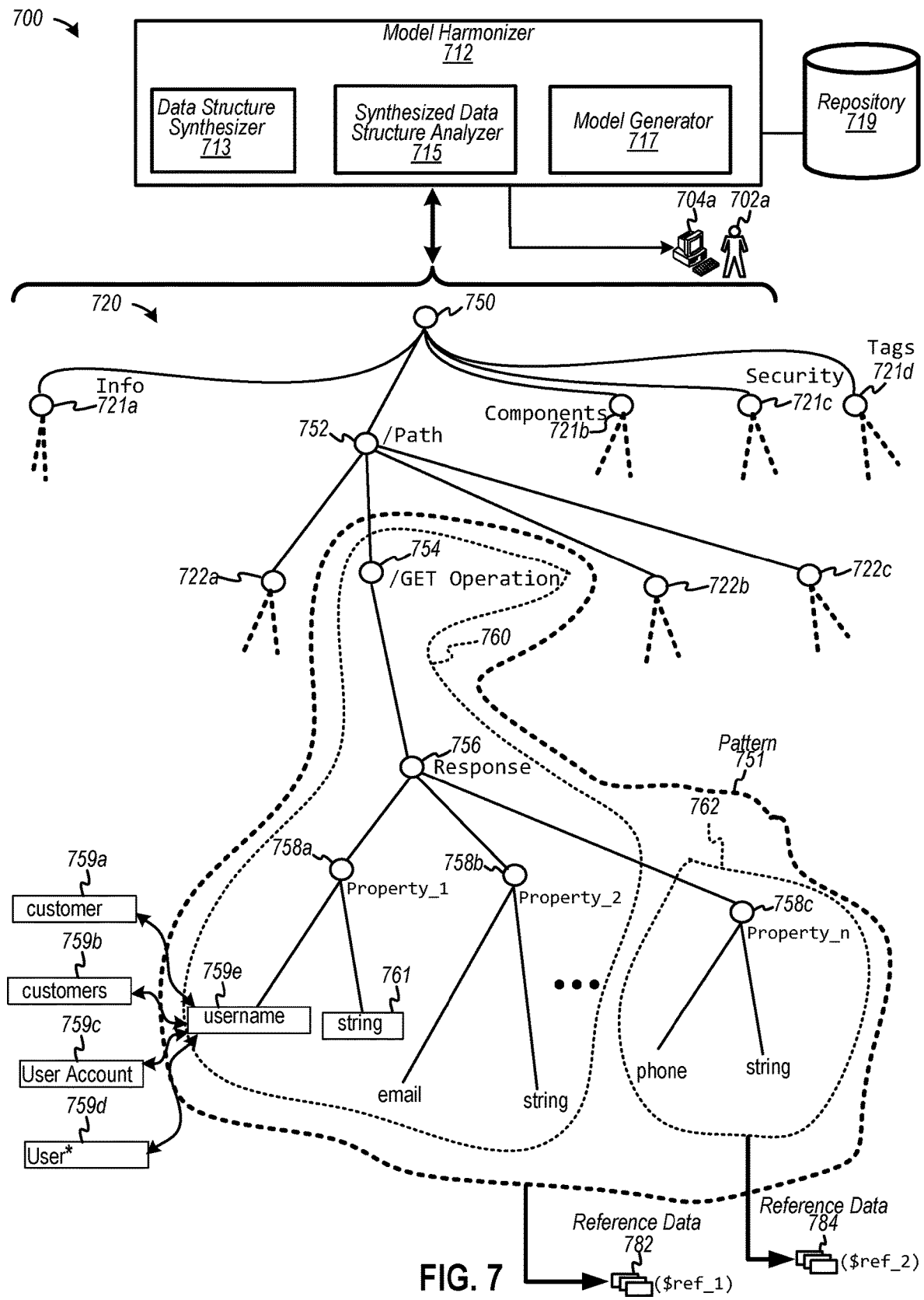
FIG. 7 is a diagram depicting another example of a model harmonizer configured to generate a model based on an example of synthesized data structure, according to some examples.

FIG. 7 is a diagram depicting another example of a model harmonizer configured to generate a model based on an example of synthesized data structure, according to some examples. Diagram 700 depicts model harmonizer 712 including a data structure synthesizer 713, a synthesized data structure analyzer 715, a model generator 717, and a repository 719. Data structure synthesizer 713 may be configured to generate a synthesized data structure 720 to compare one or more portions of synthesized data structure 720 (for an API definition) against other portions of other synthesized data structures associated with (e.g., mapped to) other API definitions. Synthesized data structure analyzer 715 may be configured to analyze multiple synthesized data structures mapped to corresponding API definitions to detect patterns. Similar or equivalent patterned data can indicate duplicate or redundant portions of API definitions that may be used to form a model representative of the duplicative portions of API definitions. Based on matched patterns among analyzed synthesized data structures, model generator 717 may be configured to form a model representative of a portion of an API definition. According to some examples, model generator 717 may be further configured to identify a duplicative portion of an API definition and replace that portion with a reference (e.g., "$ref") to a location at which a model of the duplicative portion resides. One or more elements depicted in diagram 700 of FIG. 7 may include structures and/or functions as similarly-named or similarly-numbered elements depicted in other drawings, or as otherwise described herein, in accordance with one or more examples, such as described relative to FIG. 4 or any other figure or description herein.

According to some examples, data structure synthesizer 713 may be configured to synthesize data structures for each API definition in a group of API definitions stored in, for example, repository 719, and data structure synthesizer 713 may be further configured to generate a data dictionary of elements or components of the synthesize data structures. The data dictionary may include a dictionary of objects including data representing object types and property types. Further, the data dictionary may also include data representing associations that relate object types, property types, and other data (e.g., metadata) from application interfaces (e.g., APIs) for which data structures are synthesized. In some examples, data structure synthesizer 713 may be configured to synthesize data structures from API definitions or any other API file, specification, document, or the like. Thus, data structure synthesizer 713 may determine at least one application interface description language with which an application interface is formed, such as an API specification that defines a subset of objects (and object types), properties (and property types), and other data that comply with structures, functions, and hierarchical relationships among various API elements of the API specification.

In the example shown, data structure synthesizer 713 may be configured to generate syntactic data structures for each application interface or API under analysis. In at least some examples, data structure synthesizer 713 may generate a syntactic data structure as an abstract syntax tree, or "AST." An AST, at least in some examples, may be a graph or tree data representation of an abstract syntax structure of an API definition set forth consistent with an API specification. Nodes an abstract syntax tree may refer to an object or object type compliant with an API specification, such as an OpenAPI specification, as well as properties and property types, among other data. In at least one implementation, data structure synthesizer 713 may be configured to generate a syntactic data structure by identifying one or more objects (or object types) as nodes at a hierarchical level, such as node ("Info") 721a, node ("/path") 752, node ("Components") 721b, node ("Security") 721c, and node ("Tags") 721d, among other nodes or object types. In this example, nodes 721a to 721d and 752 are disposed in a first hierarchical level, and nodes 721a to 721d may be referred to "root nodes" or "root level objects" in accordance with OpenAPI specification version 3.0 (e.g., version 3.0.1), or any other version, or any other API specification. These nodes may be associated with a vertex node, node 750, which represents an object specifying an API definition formed in accordance with specific API specification (e.g., OpenAPI specification), according to at least one example.

With continued synthesis of a data structure (e.g., an AST representation of an API definition), data structure synthesizer 713 may recursively loop down and through other hierarchical levels (e.g., a second or subsequent levels) to identify one or more objects, sub-objects, properties, etc., as other nodes 722, whereby data structure synthesizer 713 may be configured to determine properties and corresponding values for other objects (and other object types) at different hierarchical levels (e.g., at lower hierarchical levels) to form a tree graph. Further to the example shown, consider that data structure synthesizer 713 may recurse through and transform an API definition into a synthesized data representation (e.g., an AST). From node 752, data structure synthesizer 713 may generate additional tree extension (or branch) structures to form nodes 722a to 722c, as well as node 754, which may be associated with a "/GET" operation. Data structure synthesizer 713 can continue to recurse through the API definition to identify a response object 756, among other objects not shown. As shown, a response object associated with node 756 of an AST may include node ("Property_1") 758a, node ("Property_2") 758b, and node ("Property_n") 758c, each of which may represent one of any number of properties associated with the response object. For each property node, such as property node 758, a property type and a corresponding value (or expected value) may be associated thereto. As shown, property node 758a includes a property type 759e associated with a "username" property type and a corresponding value 761 (as an expected string value of alphabetic characters representing a name).

Upon generating a synthesize data structure 720 for an API definition, data structure synthesizer 713 may be configured to continue forming other syntactic data structures for other application interfaces, whereby the other syntactic data structures may be stored within a data dictionary in repository 719. For example, consider that an entity or an organization develops 100 to 1,000 application interface definition files among any number of different groups or teams of developers, whereby each application interface definition file may represent an API in a particular format or API specification. Thus, 100 to 1,000 synthesized data structures (e.g., ASTs) may be generated and stored in repository 719 for further analysis. Data structure synthesizer 713, therefore, may be configured to automate the manual task of sifting through hundreds of different API definition files and components of the API definitions in each to assist a user 702a (via computing device 704a) to find patterns and opportunities for re-use and compliance, at least in accordance with some implementations.

Synthesized data structure analyzer 715 may be configured to analyze nodes of synthesized data structures (e.g., AST representations) for each API definition in a data dictionary in repository 719 to detect patterns in a first synthesized data structure (a first AST structure for a first API) that may match one or more other synthesized data structures (or AST structures for other APIs). Diagram 700 depicts a pattern 751 of data including a data pattern of an object 754 and associated sub-objects (and object types), such as object 756, and associated properties at nodes 758a to 758c (and property types). In some examples, synthesized data structure analyzer 715 may be configured to identify pattern 751 and match that pattern (or portions thereof) against other portions of one or more other synthesized data structures to detect a matched pattern common over multiple API definitions.

In at least one example, synthesized data structure analyzer 715 may be configured to identify pattern 751 for one API definition as matching another pattern as "candidate duplicate patterns." A candidate duplicate pattern may be a subset of data that describes a sufficient overlap (or substantially sufficient overlap) of object types and property types to be deemed or equated as "duplicates." One or more threshold criteria may be evaluated to determine whether a portion of a synthesized data structure (or AST) for a first API matches sufficiently to a portion of another synthesized data structure (or AST) for a second API. To determine a candidate duplicate pattern, synthesized data structure analyzer 715 can access data representing one or more threshold criteria from, for example, threshold data files in repository 719, and can compute a degree of similarity between each candidate duplicate pattern in a subset of candidate duplicate pattern. The degree of similarity may be determined as a function of one or more threshold criteria.

As an example, synthesized data structure analyzer 715 can detect a first node common between at least two syntactic data structures by comparing node 754 (representing a "/GET" operation) in a first syntactic data structure with another node (representing a "/GET" operation) in a second syntactic data structure. In this example, the GET operation may be configured to retrieve personal contact information for a user having a particular "username." Subsequently, synthesized data structure analyzer 715 may recurse down and through portions of a tree graph to match, for example, other nodes in the first and second syntactic data structures, such as node 756 (e.g., a response object) as well as nodes 758b and 758c, which may define "email" properties and "phone" properties, respectively.

To further reduce duplicate API definitions and enhance harmonization among API definitions for an organization or entity, synthesized data structure analyzer 715 may be configured to retrieve synonym data from repository 719 to harmonize node descriptions, such as node 759e, which may specify a property as including a "username." Synthesized data structure analyzer 715 then may be configured to detect other similarly-located (e.g., within structure of pattern 751) nodes having equivalent definitions or associations, such as a "customer" definition 759a, a "customers" definition 759b (e.g., plural definition), a "user account" definition 759c, a "user*" definition 759d (where "*" may represent any variable pattern of characters, as a wild card), or any other equivalent term, definition, structure, or function. As these definitions and associations for terms 759a to 759e may be used interchangeably, similar patterns 751 of different synthesized data structures where node 758a is associated with any of terms 759a to 759e may be determined to be matched duplicates.

Synthesized data structure analyzer 715 may be configured to classify two or more candidate duplicate patterns as a matched pattern based on a degree of similarity. A degree of similarity may be determined as to whether each of candidate duplicate patterns meet or comply with threshold criteria. For example, a threshold criterion may set forth a requirement that a pattern 751 ought to include at least "n" number of properties, such as "ten properties" and associated nodes 758a, 758b, and other nodes at an equivalent hierarchical level. In some examples, a threshold criterion may have a tolerance or range of suitably or sufficiently matched patterned data. For instance, synthesized data structure analyzer 715 may detect a first subset of synthesized syntactic data structures that may include a number of patterns 751, which, in turn, may include sub-patterns of data 760 and 762. Consider that a threshold criterion specifies at least "n" number of properties in a pattern is a threshold with which to classify candidate patterns 751 as matched patterns. Thus, patterns 751 associated with any API may be classified as matched patterns. Next, consider that a second subset of synthesized syntactic data structures may include a number of sub-patterns 760 and may omit sub-pattern 762.

In response, synthesized data structure analyzer 715 may be configured to tag sub-patterns 760 and 762 for presentation at a user interface of computing device 704a so that a user 702a may optionally provide user input to determine whether sub-patterns 760 and 762 may be flagged for reference generation by model generator 717. Synthesized data structure analyzer 715 may be further configured to detect potential duplicates or inconsistencies for presentation via computing device 704a. Also, synthesized data structure analyzer 715 enables a user to quickly visualize, for example, a term that may be suitably be replaced, such as replacing or equating the term "customer" with "username," which may exist as a business object in several different API definition files. So if each of a large number of API definition files (e.g., hundreds to thousands, or greater) are created by many different teams (e.g., ten teams or more), a "customer" definitions inside of the files are likely to be different between the different teams. Thus, synthesized data structure analyzer 715 may be configured to automatically harmonize or associate terms consistently. Note the above-described threshold criterion is exemplary and is not intended to be limiting. As such, any other type of threshold criteria may be implemented to determine whether to classify to candidate patterns as matched patterns Model generator 717 may be configured to identify matched patterns generated at synthesized data structure analyzer 715 and stored in repository 719. Model generator 717 may be configured further to identify each matched object, property, value, component, portion, etc., of matched patterns, and map matched nodes of a matched pattern (e.g., of a first syntactic data structure and a second syntactic data structure) to duplicative portions of multiple application interfaces, or APIs. Hence, model generator 717 may identify duplicated objects and properties of a subset of API definitions that are similar or substantially similar. For each duplicated portion of an API definition file, model generator 717 may be configured to generate a model of the duplicative portion of an API definition file, whereby the duplicative portion may be extracted and stored elsewhere (e.g., in the same API definition file or externally in memory or repository 719 as a reusable and harmonized model configured for subsequent use and reuse). As shown, a duplicative portion for an API definition file, which corresponds to sub-pattern 762, may be associated with reference data ("$ref_2") 784, which may reference a generated model or schema based on sub-pattern 762. Note, reference data ("$ref_2") 784 may be a "nested" reference within reference data ("$ref_1") 782, which is generated to point or reference a model generated based on pattern data 751.

Figure 8:
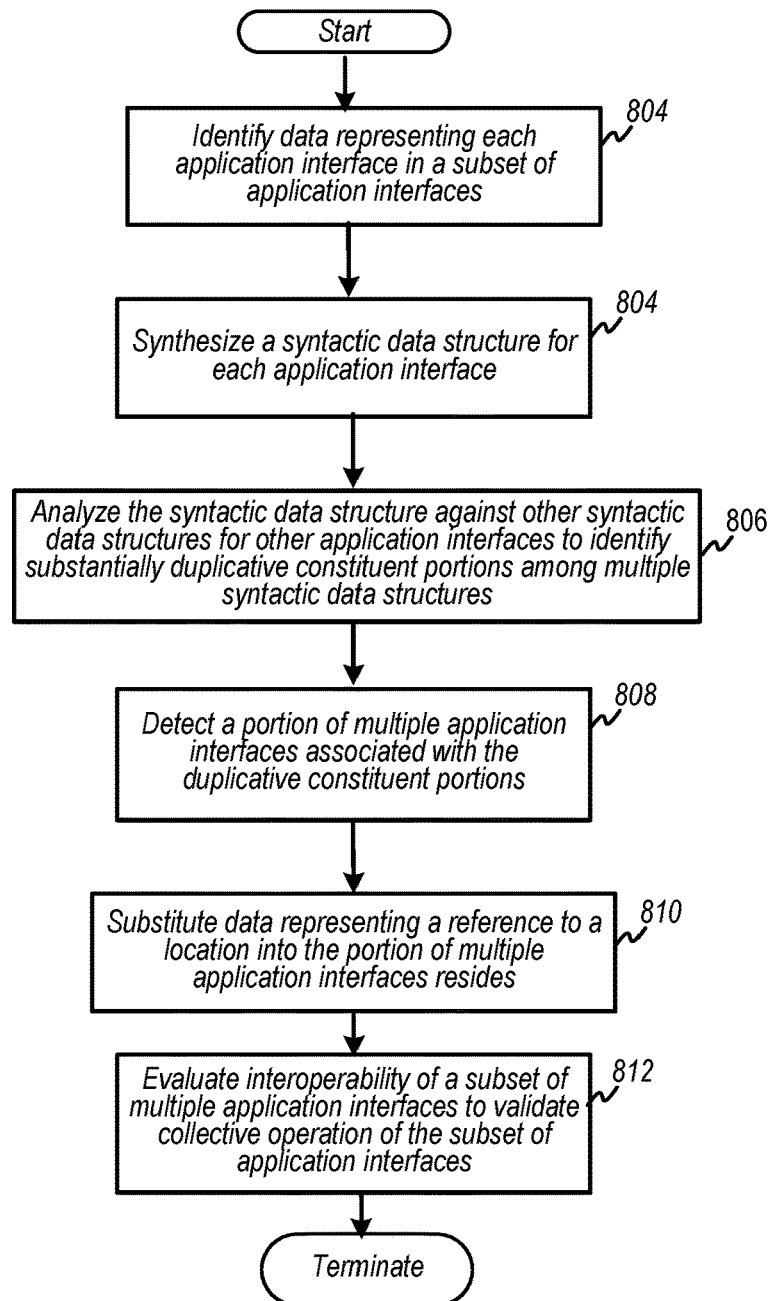
FIG. 8 is a flow diagram depicting an example flow for reducing duplication of application interface files and portions thereof, according to some examples.

FIG. 8 is a flow diagram depicting an example flow for reducing duplication of application interface files and portions thereof, according to some examples. Flow diagram 800 includes 802, at which data representing each application interface in a subset of application interfaces, or APIs, may be identified. At 804, a data structure (e.g., a syntactic data structure) may be synthesized for each application interface in the subset. In some examples, a syntactic data structure may include an abstract syntax tree data structure. At 806, a syntactic data structure may be analyzed against other syntactic data structures for other application interfaces (e.g., other APIs) to identify duplicative or substantially duplicative constituent portions among multiple syntactic data structures. A substantially duplicative constituent portion is a portion that may have a degree of similarity determined within a range of acceptable values for one or more threshold criteria. At 808, a portion of multiple application interfaces associated with the duplicative constituent portions may be detected as, for example, candidate duplicate patterns. At 810, data representing a reference to a location may be substituted into a portion of multiple application interfaces files (e.g., API definition files) to replace a duplicative portion of an API definition file. At 812, interoperability of a subset of multiple application interfaces may be optionally evaluated to validate collective operation of a subset of application interfaces, which may include at least a reference inserted automatically into an API definition file.

Figure 9:
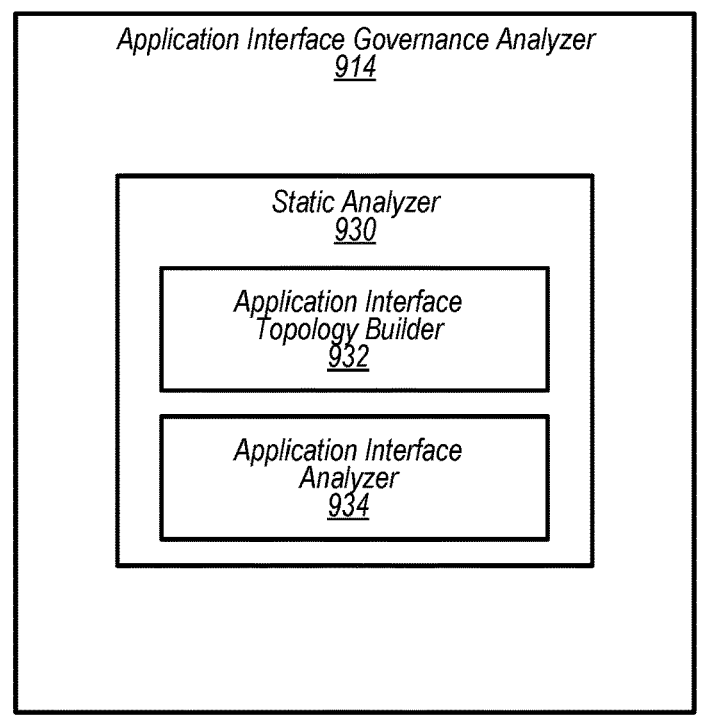
FIG. 9 is a diagram depicting an example of an application interface governance analyzer including a static analyzer, according to some examples.

FIG. 9 is a diagram depicting an example of an application interface governance analyzer including a static analyzer, according to some examples. Diagram 900 depicts an application interface governance analyzer 914 including a static analyzer 930, which, in turn, is shown to include an application interface topology builder 932 and an application interface analyzer 934. Static analyzer 930 may be configured to statically analyze interoperation and exchanged data in a system of application interfaces, whereby static analysis may be performed at design time as code is being developed. One or more elements depicted in diagram 900 of FIG. 9 may include structures and/or functions as similarly-named or similarly-numbered elements depicted in other drawings, or as otherwise described herein, in accordance with one or more examples, such as described relative to FIG. 1 or any other figure or description herein.

An application interface topology builder 932 may be configured to identify one or more applicable API definitions and associated API specifications in a system of application interfaces. Further, application interface topology builder 932 may be configured to automatically build and maintain an API topology (e.g., a topology of API definitions and resource descriptions used by an entity or an organization). Application interface topology builder 932 may detect and store dependencies among application interfaces or APIs in the API topology, whereby the dependencies and functional and/or structural relationships may be stored as a dependency graph. As an example, consider again that application interface 122a of FIG. 1 may be configured to perform an overarching ordering service dependent on functionalities of application interfaces 122b, 122c, and 122d, which may be configured to perform a customer information service, a payment service, and a shipment service, respectively. Note, too, the payment service may depend on the customer information service to determine a specific user account and payment information. These dependencies, and others, may be captured in an API topological graph of dependencies that may specify dependencies among, for example, resources, methods, operations, endpoints, and exchanged data among APIs.

Referring back to FIG. 9, application interface analyzer 934 may be configured to automatically analyze an API definition against an API specification to validate, for example, syntax and semantic compliance, among other requirements or standardized data formats for an API specification (e.g., static analysis may be implemented automatically to validate against, for example, an OpenAPI specification). To illustrate, consider an example in which application interface analyzer 934 may analyze an API definition developed based on the OpenAPI speciation. Hence, application interface analyzer 934 can analyze root objects and sub-objects, properties, models, etc. to determine compliant usage with either version 2.0 or version 3.0 (or any other versions) of an OpenAPI specification. Examples of root objects include an info object, a server object, a paths object to generate requests and receive responses, a components object, a security requirement object, a tag object, etc. Values may be matched against valid datatypes of one or more properties (e.g., to confirm whether a value is an integer, a string, or other valid datatype).

Application interface analyzer 934 may be configured to automatically analyze models and/or schema objects that may be used to model a structure of a request or a response to determine whether a model is in a specification-compliant format. For example, a model may be a data structure including, for example, properties, fields, values, and hierarchy of various objects and properties, each of which can be analyzed statically to determine validity or detect inconsistencies. Thus, application interface analyzer 934 may be configured to analyze whether one or more objects conform to either JSON or YAML, or any other suitable formats, such as XML, curl, etc. For example, application interface analyzer 934 may be configured to automatically analyze API definitions to confirm compliance with specified format, such as JSON, YAML, XML, etc., which may be compliant with OpenAPI specifications. Application interface analyzer 934 may be configured to automatically analyze code automatically generated to form responses and requests in a variety of programming languages and formats, including cURL.

According to some examples, application interface analyzer 934 may be configured to perform static analysis to determine whether a reference pointer (e.g., "$ref") for a schema object points to a valid location, which may be a different file or network location (pointed to by a reference in the current file) that may be dereferenced. In some implementations, a pointer may point to referent data (e.g., remote content), which may be retrieved from a referent application interfaces at the location and inserted to replace the reference. In some cases, application interface analyzer 934 can statically analyze an API definition in the background to validate data associated with the pointers in the files (e.g., validating periodically, such as once per day, whether at design time or at run time).

Figure 10:
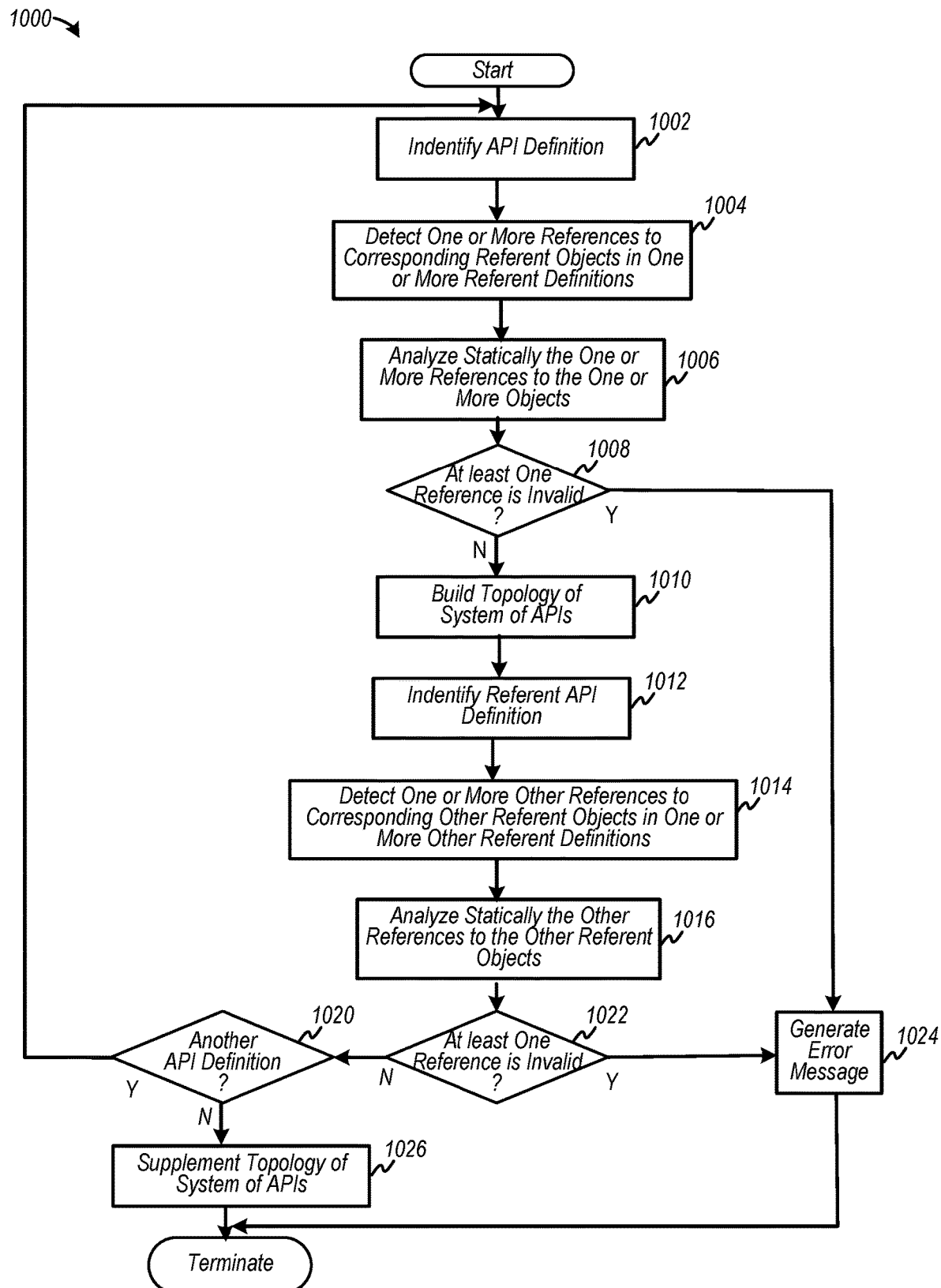
FIG. 10 is a flow diagram depicting an example flow for performing a static analysis of one or more application interfaces, according to some examples.

FIG. 10 is a flow diagram depicting an example flow for performing a static analysis of one or more application interfaces, according to some examples. Flow diagram 1000 includes 1002, at which data representing an application interface definition may be identified for performing static analysis. Also, a relevant API specification that corresponds to the API definition under static analysis may be identified, too. At 1004, one or more references in the API definition may be detected, whereby the references may point to corresponding referent objects in one or more referent API definitions for other APIs. Referent object may include objects (and/or properties, endpoints, resources, etc.) being referred to, or to which a reference points. Referent API definitions may include API definition being referred to, or to which a reference points. Interrelationships among the detected references and referent API definitions may be stored in data structure to build an API topology. As such, flow 1000 may also be implemented to build an API topology. At 1006, one or more references to the one or more objects may be statically analyzed. At 1008, a determination is made whether at least one reference is invalid, or whether the data being referenced may not be compliant with an API specification. If a statically-analyzed reference yields an error or an indication of invalidity, flow 1000 moves to 1024, at which an error message may be generated.

Otherwise, flow 1000 moves to 1010, at which a topology of a system of APIs may be built. An API system topology may include a data structure identifying, for example, operations performed by APIs in a system of APIs, including response data and request data, as well as model data, and the like. At 1012, a referent API definition may be identified. For example, a referent API definition may include, or may be otherwise associated with, a resource, an endpoint, a method, or any other data to which a reference points. At 1014, one or more other references in the referent API definition may be detected. The one or more references may point to corresponding other referent objects in one or more other referent API definitions. Thus, a number of API definitions and references may be detected or identified, thereby increasing a number of additional referent APIs and references to be analyzed statically. Detected API definitions and references may be included the building or supplementation of a topology of a system of APIs. At 1016, the other references may be statically analyzed, whereby the other reference may point to other referent objects associated with the one or more referent API definitions.

At 1022, a determination is made whether at least one reference is invalid, or the data being referenced may not be compliant with an API specification. If a statically analyze reference yields an error or other indication of invalidity, flow 1000 moves to 1024, at which an error message may be generated. At 1020, a determination is made as to whether another API definition has yet to be analyzed or included in building an API topology. In so, flow 1000 returns to 1002 to identify the additional API definition and perform static analysis thereupon. If not, flow 1000 moves to 1026, at which a topology of a system of APIs may be supplemented by detected dependencies as determined, for example, a flow from 1002 to 1020. Note that while flow 1000 describes both a static analysis flow and a flow to build an API topology, the building of an API topology and a static analysis may be performed independently in accordance with some examples.

Figure 11:
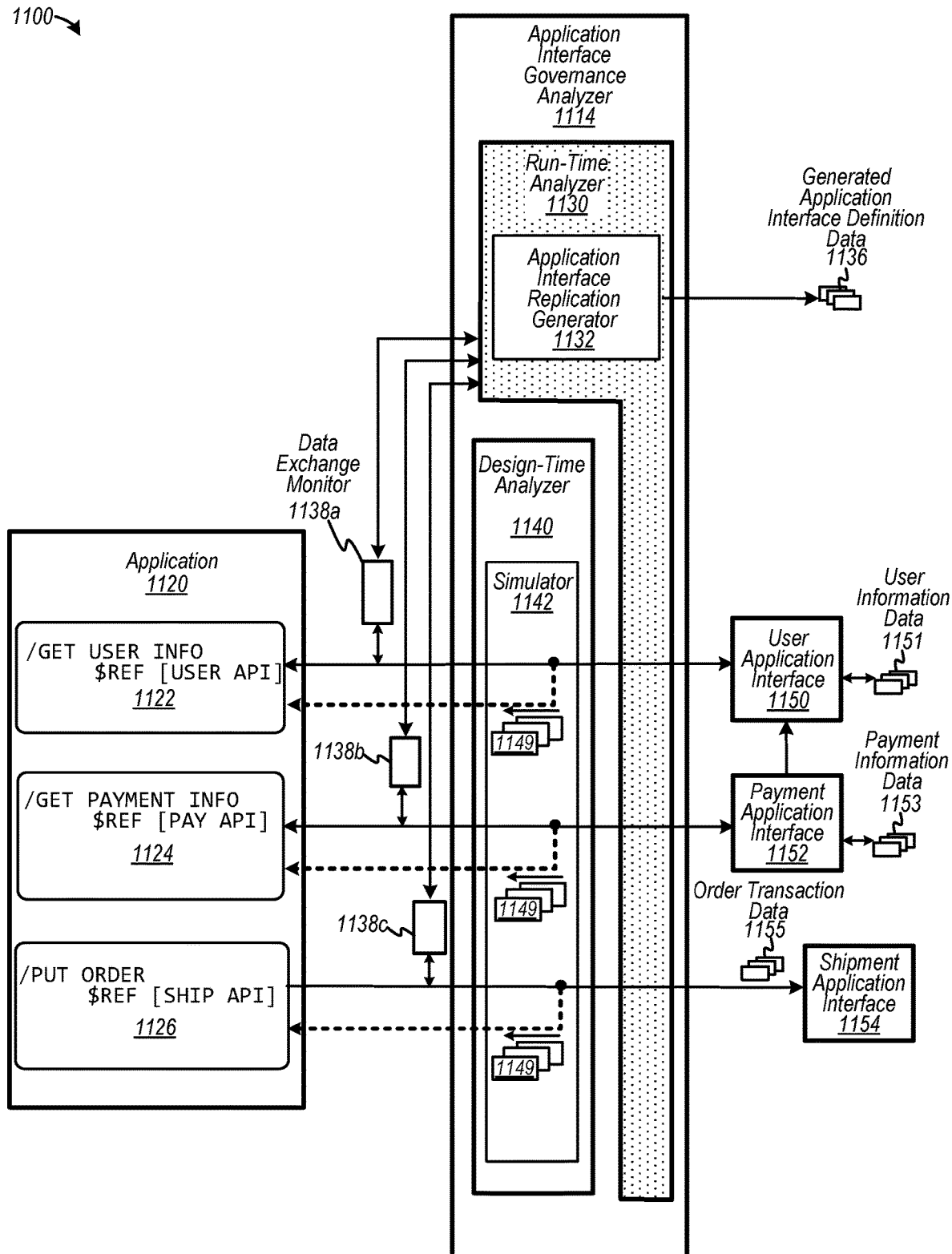
FIG. 11 is a diagram depicting another example of an application interface governance analyzer to perform dynamic design time analysis, to perform run time analysis, and/or to replicate legacy application interface definitions, according to some examples.

FIG. 11 is a diagram depicting another example of an application interface governance analyzer to perform dynamic design time analysis, to perform run time analysis, and to replicate legacy application interface definitions, according to some examples. Diagram 1100 depicts application interface governance analyzer 1114 including a design-time analyzer 1140 and a run-time analyzer 1130, according to some examples. Design-time analyzer 1140 may include a simulator 1142, and run-time analyzer 1130, which, in turn, may include an application interface replication generator 1132 to replicate functionality of a legacy API to form a specification-compliant API definition. In some examples, simulator 1142 may transmit a retrieved response (e.g., a simulated response 1149 including expected remote content) to the requesting program or application 1120, which may include a requesting API definition-under-test. Thus, simulated response 1149 may be transmitted to application 1120 in a transparent manner to validate interoperability of APIs dynamically, for example, at design time. One or more elements depicted in diagram 1100 of FIG. 11 may include structures and/or functions as similarly-named or similarly-numbered elements depicted in other drawings, or as otherwise described herein, in accordance with one or more examples, such as described relative to FIG. 1 or any other figure or description herein.

Design-time analyzer 1140 may be configured to perform design time analysis, and may implement simulator 1142 to perform a simulation to analyze, dynamically. Thus, design-time analyzer 1140 may validate operation of a system of application interfaces, or APIs, dynamically at design time. In a simulation, design-time analyzer 1140 may be configured to analyze execution of a program (e.g., application 1120) implementing an API definition-under-test to, for example, detect when a reference is invoked. A reference may be a pointer configured to point to an API element (e.g., a model, a resource, etc.) defined in a different portion of the same or different API definition file or network location to be dereferenced. Design-time analyzer 1140 may implement simulator 1142 as a proxy to retrieve referenced remote content at a referent API (e.g., APIs 1150, 1152, or 1154), as well as log or store data representing requests and corresponding responses.

In one example, design-time analyzer 1140 may be configured to identify references (e.g., $ref) in an API definition-under-test, and may be configured further to detect calls or requests via references to a referent application interface (e.g., a referent API, such as APIs 1150, 1152, and 1154). Upon detecting a call via a reference to a location, design-time analyzer 1140 may be configured to intercept and divert a request to a simulator 1142, which may operate as a proxy. A simulated response 1149 may be transmitted, responsive to the diverted request, back to the referring API (e.g., one of APIs 1122, 1124, and 1126) for analysis to determine whether the request-response data is valid or compliant with expected results. Or, in some cases, references (e.g., "REF [USER API]") in an API definition-under-test, such as API 1122, may be modified during simulation to point to simulator 1142 rather than pointing directly to a referent API (at which remote content may be located).

To illustrate, consider that an OpenAPI definition including APIs 1122 to 1126 may contain a "$ref," which indicates that the text following the $ref is a pointer to remote content. For example, a reference specified as "$ref/remoteURL/ customer" may indicate that an application implementing an API may access a location pointed to by path "/remoteURL/ customer" and retrieve data (e.g., text) from a remote location. Then, a design-time analyzer 1140 may be configured to substitute the $ref with the retrieved data. In some examples, design-time analyzer 1140 may be configured to cause references in the form of "$ref/remoteURL" to point to (or divert to) a simulator 1142 (e.g., as a proxy server). Note that in some examples, a reference "$ref" may be generated by model generator 717, and may be included in a simulation to test or validate implementation of a generated model resulting from analyzing synthesized data structures, as described in FIG. 7.

Referring back to FIG. 11, application 1120 may include a number of APIs 1122, 1124, and 1126 to facilitate an on-line merchant shopping and ordering system, API 1122 may be associated with an API definition that includes a first operation ("/GET USER INFO") to acquire customer-related contact information via a reference (e.g., "$REF [USER API]") to user application interface ("API") 1150. API 1150 may be configured to access user information data 1151 from a repository (not shown), and generate a response including user information for transmission to API 1122. API 1124 may be associated with an API definition that includes a second operation ("/GET PAY INFO") to acquire payment-related information via a reference (e.g., "$REF [PAY API]") to payment application interface ("API") 1152, including confirmation whether a payment transaction has been completed for a particular user. As shown, API 1152 may reference API 1150 to retrieve customer-related contact information to facilitate a payment transaction. Further, API 1152 may be configured to access payment information data 1153 from a repository (not shown), and generate a response including payment confirmation information for transmission to API 1124. API 1126 may be associated with an API definition that includes a third operation ("/PUT ORDER") to place or initiate an order to be shipped from a third party seller having access to inventory of an ordered item. Hence, API 1126 may transmit order transaction data 1155 via a reference (e.g., "$REF [SHIP API]") to shipment application interface ("API") 1154, which may be configured to initiate shipment of an ordered item to a particular user.

Further, design-time analyzer 1140 and/or simulator 1142 may operate as a proxy to retrieve the referenced remote content at a referent API, and may further log or store data representing requests and corresponding responses. Also, design-time analyzer 1140 and/or simulator 1142 may transmit a retrieved response (e.g., the remote content) to the requesting application (associated with the requesting API definition-under-test) in a transparent manner. In particular, the retrieved response may be consumed by the requesting application "transparently," which indicates that a requesting application 1120 need not have knowledge to operate in a compliant manner.

The logged data among APIs 1122, 1124, 1126, 1150, 1152, and 1154 may be used to confirm valid operations in a system of APIs 1122, 1124, 1126, 1150, 1152, and 1154, whereby the logged operations may be transform logged API data traffic exchanges to one or more API descriptions. The one or more API descriptions may be used as templates or data patterns against which data monitored at "run time" may be used to determine whether API operations are valid during run time (and whether a revision or change to a referent API definition for APIs 1150, 1152, and 1154 may affect negatively a calling API, such as APIs 1122, 1124, and 1126). In some examples, a simulator application may be referred to as a "design time analyzer," or a portion thereof, such as depicted in FIG. 11 (and other figures), or as an "API Automated Governance Solution Design Time Server."

According to at least one embodiment, design-time analyzer 1140 and/or simulator 1142 may be configured to intercept requests via a reference to a remote location, and may be configured further to modify or "shape" the data representing retrieved requests in accordance with one or more policies (e.g., filtering rules). A policy may be created and applied during the dereference process such that the original content being returned may be modified by simulator 1142 based on the policy. Thus, response modification (in view of a policy) may be simulated and tested to confirm valid operation of application 1120 implementing an API interoperating in a system of APIs. For example, payment information data 1153 being returned in a response from API 1152 may include sensitive or confidential payment information (e.g., credit card numbers, bank routing numbers, social security numbers, etc.), and a policy may specify that such information shall be excluded or masked from application 1120. Simulator 1142, in response to the policy, may be configured to modify a retrieved object to exclude or mask one or more properties associated with a response. For example, application 1120 may not be authorized to access certain data, such as payment information (e.g., credit card numbers, bank routing numbers, social security numbers, etc.). Thus, simulator 1142 may be configured to remove credit card data prior to transmitting the retrieved data back to API 1124 (e.g., to dynamically confirm or validate the masking of sensitive information).

Run-time analyzer 1130 may include one or more similar or equivalent structures and/or functions of simulator 1142 that may be implemented at run time. In some examples, run-time analyzer 1130 may be implemented at run time to analyze data exchanges among any of APIs 1122, 1124, 1126, 1150, 1152, and 1154. At run time, a run-time analyzer 1130 may receive requests via a reference in an API definition associated with one of APIs 1122, 1124, and 1126, and then may transmit the requests to the locations of the referent APIs 1150, 1152, or 1154 rather than diverting the requests to internal logic (e.g., a simulated response generator, such as with simulator 1142) in simulator application 1142. In at least one implementation at run time, run-time analyzer 1130 may be configured to operate as a proxy and receives API requests being called at run time as had been called during design time (e.g., the design and development process). Further, run-time analyzer 1130 may be configured to perform runtime governance on a request based on, for example, an API signature being called.

In other examples, application interface governance analyzer 114 may be configured to monitor data exchanges via data exchange monitors 1138a, 1138b, and 1138c, whereby the data exchanges may represent requests and responses at run time. Thus, data exchange monitors 1138a, 1138b, and 1138c may capture or store the data exchanges for subsequent transmission to logic in run-time analyzer 1130 that may be configured to analyze whether request-response data are valid, and whether a system of application interfaces are operating in a compliant matter. In some examples, logic implemented as one or more data exchange monitors 1138a, 1138b, and 1138c may be configured to monitor or "siphon off" data traffic passing through an API (e.g., in parallel to a flow of date in a non-intercepting manner). Data exchange monitors 1138a, 1138b, and 1138c may be configured to periodically (or aperiodically) send logged data to "collector" software for further analysis within run-time analyzer 1130. Run-time analyzer 1130 may generate resultant messages to transmit for presentation of results from run-time testing at a user interface (e.g., whether an error exists). A developer then may remediate a detected error, or the error may be remediated automatically.

Application interface replication generator 1132 may be configured to detect and identify legacy application interfaces as well as request-response services and data exchanged therewith, and may be further configured to generate a replication of an API based on monitor data traffic, whereby the replicated API may be configured to conform to at least one API specification or standard. In some cases, a legacy application interface may be developed independent of an API specification or standard, and may be deployed continually so as not to expend resources to manually adapt a legacy application interface into an application interface compliant with an API standard or specification, such as the OpenAPI specification.

In some examples, application interface replication generator 1132 may be configured to receive data representing a legacy application interface, or legacy API, which may be non-compliant with respect to one or more application interface specifications. Application interface replication generator 1132 may be further configured to monitor exchanges of data via data exchange monitors 1138a, 1138b, and 1138c among application interfaces (e.g., APIs 1122, 1124, 1126, 1150, 1152, and 1154), at least one of which may be a legacy application interface. Also, application interface replication generator 1132 may be configured to generate an application interface definition for the legacy application interface to form a replicated application interface definition (e.g., a replicated API definition) to support functionality of a replicated application interface (e.g., a replicated API).

To illustrate operation of application interface replication generator 1132, consider that an organization or entity may implement dozens to tens of thousands of legacy APIs, any of which may have been developed and maintained in an ad hoc manner without conformity to an API specification. In cases like these, application interface replication generator 1132 may be configured to collect information on data traffic exchanged among a system of APIs, and uses that information to generate data 1136 representing a replicated API and associated code and data objects, properties, etc., as a replicated API definition. The replicated API definition may be compliant with one or more API specifications, and the formation thereof foregoes a requirement to manually convert a legacy API into an API definition compliant with an API specification, such as OpenAPI specification.

Figure 12:
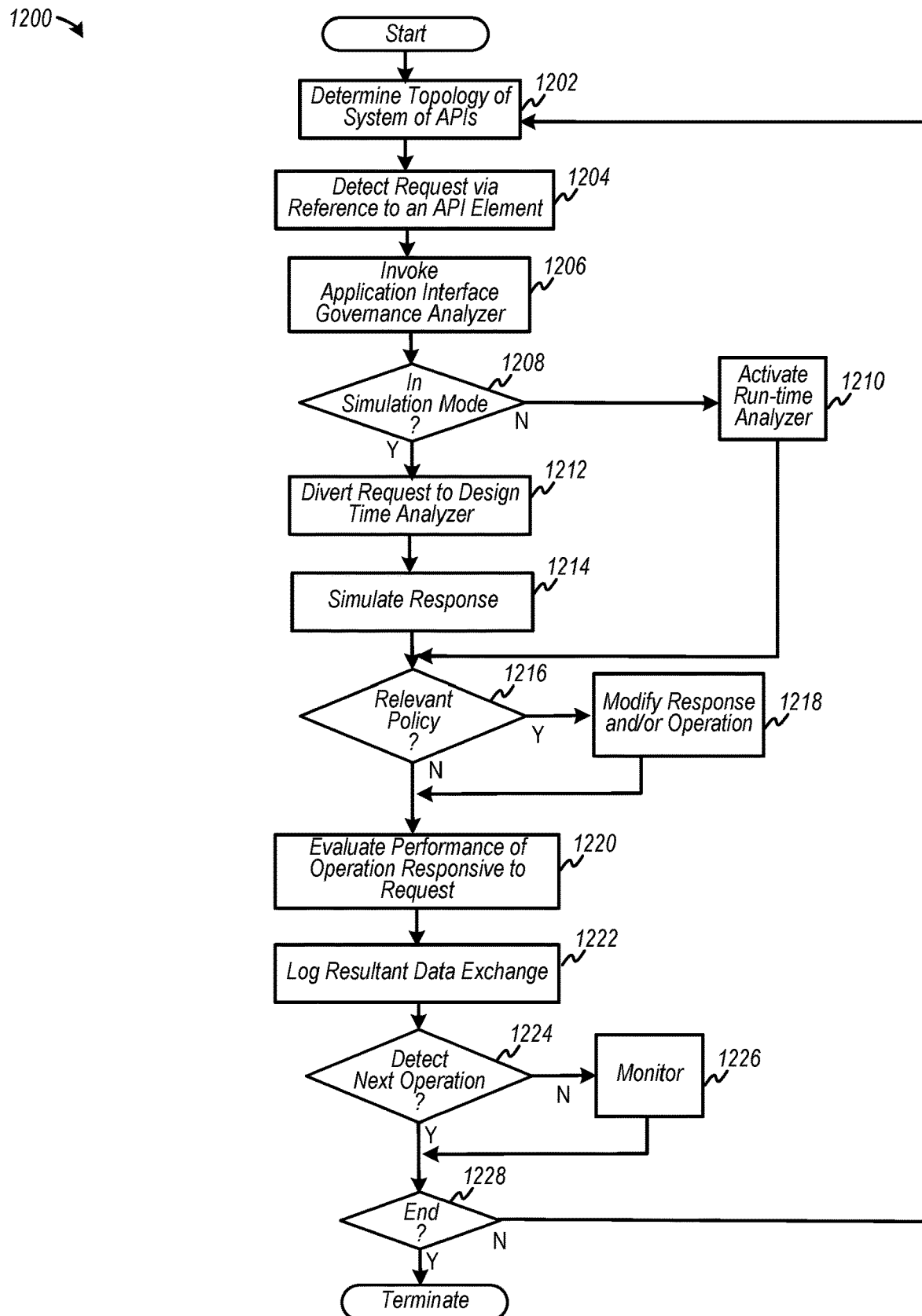
FIG. 12 is a flowchart depicting an example flow for performing dynamic analysis of the operation of a system of application interfaces either at design time or run time, or both, according to some examples.

FIG. 12 is a flowchart depicting an example flow for performing dynamic analysis of the operation of a system of application interfaces either at design time or run time, or both, according to some examples. Flow 1200 begins at 1202, whereby a topology of system of APIs may be determined by retrieving data representing the topology from memory, or by building or supplementing a topology at 1202. At 1204, a request via reference to an API element (e.g., endpoint) may be detected. Responsive to detecting the request via the reference, an application interface governance analyzer may be invoked at 1206 to perform dynamic analyses. At 1208, a determination may be made as to whether an application interface governance analyzer is in simulation mode. If not, flow 1200 may pass to 1210, at which a run-time analyzer may be activated to perform run time analysis to determine whether interoperability among APIs is valid (e.g., with negligible to no errors or inconsistencies). In this example, a run-time analyzer may be interposed between a calling API and a referent API, whereby the run-time analyzer may be configured to intercept an API call, analyze it, and then forward the API call to the referent or target API. Subsequently, the run-time analyzer may be configured to intercept an API response from the referent API, analyze it, and then pass along the API response back to the requesting API.

If in simulation mode, flow 1200 may transit to 1212, at which a request from an API-under-test may transmit a request to a design time analyzer, which may be configured to divert the request or API call to a simulation application. At 1214, a simulated response may be returned or otherwise transmitted to the originating API, at which the simulated response may be consumed and the corresponding operation analyzed to determine validity. In some cases, when a reference is resolved (e.g., dereferenced), a simulated response including one or more referent object data may be returned and inserted into the location in the API definition from which the request originates. For example, a request generated in response to detecting a reference, such as a "$ref" specifies that the following text or string may be a pointer to remote content (e.g., at a remote endpoint). An example of such text or string representing the pointer may be "/remoteURL/customer." During simulation, a simulation application may automatically go to the location pointed to by "/remoteURL/customer" and retrieve remote content (e.g., remote text) and substitute reference, $ref, with the retrieved content. In one example, the call to the location pointed by "/remoteURL/customer" may be intercepted or diverted to a simulator to generate a simulated response.

At 1216, a determination is made as to whether a relevant policy applies to an analyzed API or system of APIs. If relevant, flow 1200 may pass to 1218, at which a response (e.g., a simulated response) may be modified so as to, for example, to supplement response data or to mask sensitive data in the response. At 1220, performance of an operation (e.g., a/GET operation), responsive to a request or API call, may be evaluated to determine whether interoperation between APIs is compliant with desired operation. At run time, validation of the performance of APIs may be determined relative to data representing API descriptions that have been generated dynamically at design time. According to some examples, an API description may include a data structure specifying expected responses for corresponding requests (e.g., as simulated at design time).

At 1222, resulted data transmissions (e.g., an API request or an API response), as well as resultant exchanged data, may be logged or stored for subsequent analysis. At 1224, a determination is made as to whether a next operation is detected (e.g., a next operation based on a request object). If not, flow 1200 continues to monitor one or more API endpoints at 1226 to detect, for example, a request-response data exchange. Otherwise, flow passes to 1228. If dynamic analysis has not ended, flow 1202 passes back up to 1202, otherwise flow 1200 terminates.

Figure 13:
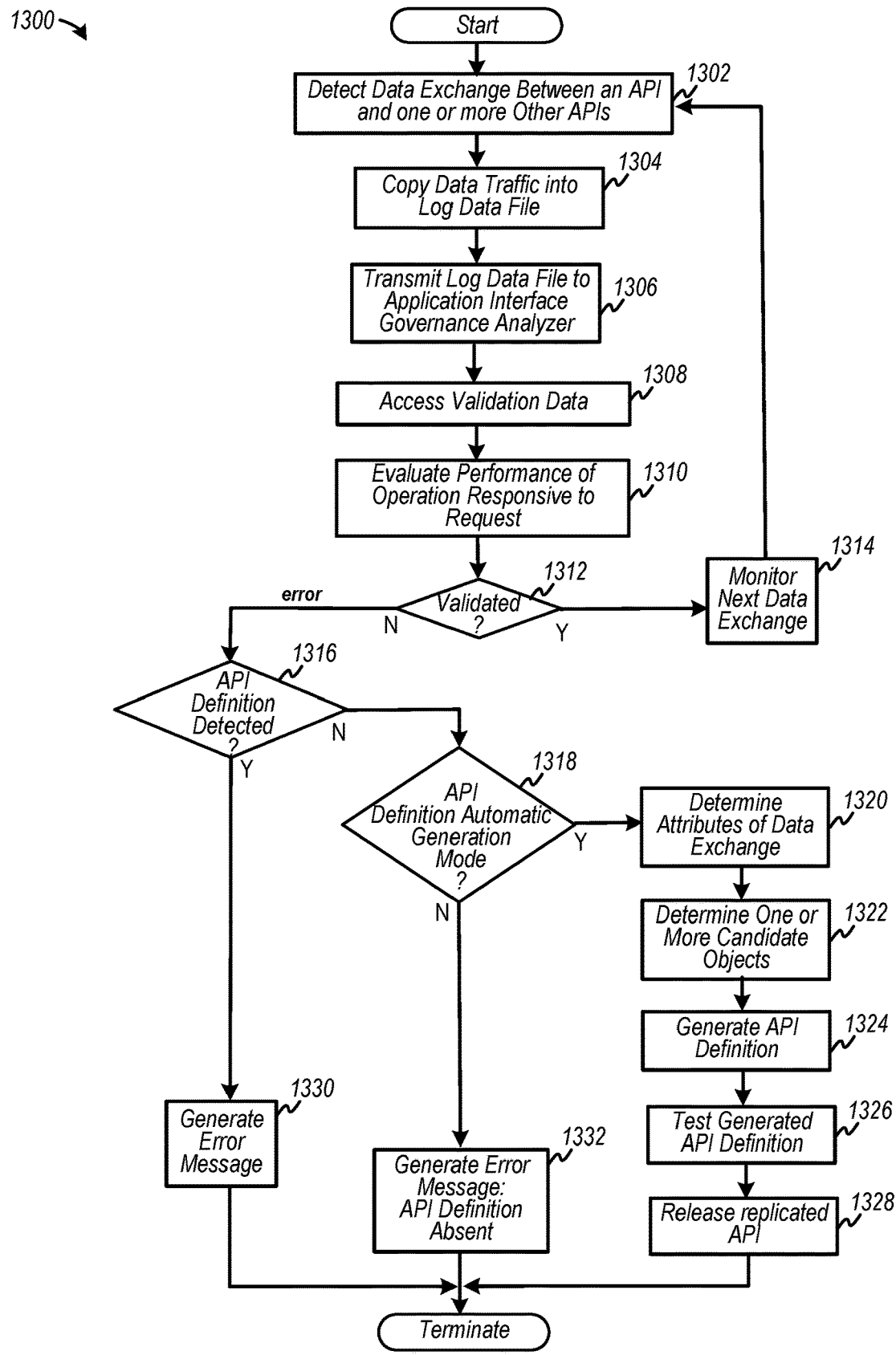
FIG. 13 is a flowchart depicting an example flow for performing run time analysis and generating an API definition for a legacy API, according to some examples.

FIG. 13 is a flowchart depicting an example flow for performing run time analysis and/or generating an API definition for a legacy API, according to some examples. Flow 1300 begins at 1302, whereby data exchanges between an API and one or more other APIs may be detected, for example, in parallel to transmitted requests and responses rather than receiving the data exchanges in series between APIs. For example, logic implemented as one or more data exchange monitors may be configured to monitor or "siphon off" data traffic either entering an API (e.g., response data) or exiting the API (e.g., request data), or both. At 1304, data traffic may be copied into a log data file, which may subsequently transmitted, at 1306, to logic at an application interface governance analyzer and/or a run-time analyzer for analysis. At 1308, validation data may be accessed, the validation data being included within, for example, one or more API descriptions, which may be used to compare data traffic to determine whether one or more APIs are interoperating compliantly at 1310. In some cases, API descriptions may include request-response data (e.g., as obtained during static or dynamic analyses) to determine valid API operation.

At 1312, a determination is made as to whether performance of an API operation is valid. If yes, flow 1300 continues to 1314, at which data traffic may be monitored for a next data exchange, which may be logged for subsequent analysis. Then flow passes back to 1302. But if an error is detected at 1312, flow 1300 may move to 1316 to determine whether an error or inconsistency may be due to an absence of an API definition that may be compliant with a specific API specification.

If a data exchange is in association with an API specification (e.g., the OpenAPI specification), then an error message is generated at 1330, and flow 1300 continues. But if the data exchange is not associated with an API specification, then the data exchange may be associated with a legacy API that need not be compliant with an API specification. At 1318, a determination may be made as to whether an automatic API definition generation mode is active. If not, flow 1300 moves to 1332, at which an error message may be generated to indicate that a compliant API definition is absent (e.g., a legacy API is detected). But if the automatic API definition generation mode is active, an application interface replication generator may be configured to replicate functionalities of a legacy API to generate an API definition compliant with an API specification. Therefore, flow 1300 may be configured to enable an organization or entity to transform dozens to tens of thousands of legacy APIs, may have been developed in an ad hoc manner, into API specification-compliant API definitions.

To generate a replicated API derived from a legacy API, flow moves to 1320 at which various attributes of the data exchange (e.g., via HTTP traffic) may be determined. For example, operations including requests and responses between two or more APIs may be analyzed to determine, for example, "paths" or URLs associated with one or more endpoints in an exchange of data between a request and a response. For monitored and captured requests, parameters may be determined (e.g., body, header, or other parameters), and response body object-related data may be determined. For a response, a schema or model may be created. Also objects, properties, values, and other data may also be correlated with requests and responses. At 1322, one or more candidate objects may be determined, whereby the candidate objects may be any object compliant with an API specification, such the OpenAPI specification. At 1324, an API definition may be generated in compliant formats (e.g., JSON, YAML, etc.). At 1326, a generated API definition, which replicates operability of the originating legacy API, may be tested or analyzed statically and/or dynamically at design time and/or at runtime, as described herein. AT 1328, a replicated API then may be released for use during run time use. Note that run time analysis and legacy API transformation may be performed independent of each other, according to some examples.

Figure 14:
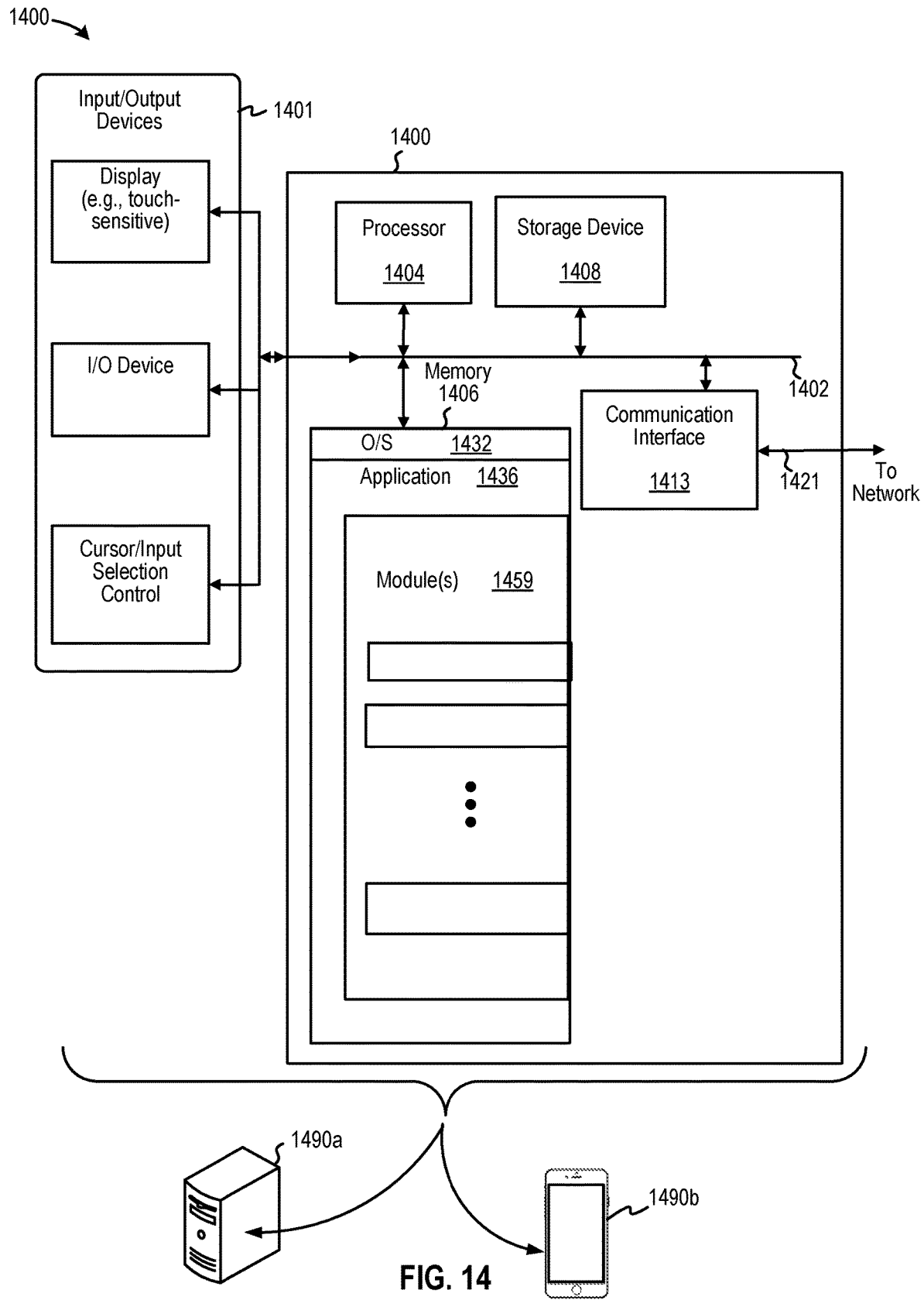
FIG. 14 illustrates examples of various computing platforms configured to provide various functionalities to any of one or more components of a collaborative dataset consolidation system, according to various embodiments.

FIG. 14 illustrates examples of various computing platforms configured to provide various functionalities to any of one or more components of an automated application interface governance platform, according to various embodiments. In some examples, computing platform 1400 may be used to implement computer programs, applications, methods, processes, algorithms, or other software, as well as any hardware implementation thereof, to perform the above-described techniques.

In some cases, computing platform 1400 or any portion (e.g., any structural or functional portion) can be disposed in any device, such as a computing device 1490a, mobile computing device 1490b, and/or a processing circuit in association with the various examples described herein.

Computing platform 1400 includes a bus 1402 or other communication mechanism for communicating information, which interconnects subsystems and devices, such as processor 1404, system memory 1406 (e.g., RAM, etc.), storage device 1408 (e.g., ROM, etc.), an in-memory cache (which may be implemented in RAM 1406 or other portions of computing platform 1400), a communication interface 1413 (e.g., an Ethernet or wireless controller, a Bluetooth controller, NFC logic, etc.) to facilitate communications via a port on communication link 1421 to communicate, for example, with a computing device, including mobile computing and/or communication devices with processors, including database devices (e.g., storage devices configured to store atomized datasets, including, but not limited to triplestores, etc.). Processor 1404 can be implemented as one or more graphics processing units ("GPUs"), as one or more central processing units ("CPUs"), such as those manufactured by Intel® Corporation, or as one or more virtual processors, as well as any combination of CPUs and virtual processors. Computing platform 1400 exchanges data representing inputs and outputs via input-and-output devices 1401, including, but not limited to, keyboards, mice, audio inputs (e.g., speech-to-text driven devices), user interfaces, displays, monitors, cursors, touch-sensitive displays, LCD or LED displays, and other I/O-related devices.

Note that in some examples, input-and-output devices 1401 may be implemented as, or otherwise substituted with, a user interface in a computing device associated with a user account identifier in accordance with the various examples described herein.

According to some examples, computing platform 1400 performs specific operations by processor 1404 executing one or more sequences of one or more instructions stored in system memory 1406, and computing platform 1400 can be implemented in a client-server arrangement, peer-to-peer arrangement, or as any mobile computing device, including smart phones and the like. Such instructions or data may be read into system memory 1406 from another computer readable medium, such as storage device 1408, or any other data storage technologies, including blockchain-related techniques. In some examples, hard-wired circuitry may be used in place of or in combination with software instructions for implementation. Instructions may be embedded in software or firmware. The term "computer readable medium" refers to any tangible medium that participates in providing instructions to processor 1404 for execution. Such a medium may take many forms, including but not limited to, non-volatile media and volatile media. Non-volatile media includes, for example, optical or magnetic disks and the like. Volatile media includes dynamic memory, such as system memory 1406.

Known forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can access data. Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 1402 for transmitting a computer data signal.

In some examples, execution of the sequences of instructions may be performed by computing platform 1400. According to some examples, computing platform 1400 can be coupled by communication link 1421 (e.g., a wired network, such as LAN, PSTN, or any wireless network, including WiFi of various standards and protocols, Bluetooth®, NFC, Zig-Bee, etc.) to any other processor to perform the sequence of instructions in coordination with (or asynchronous to) one another. Computing platform 1400 may transmit and receive messages, data, and instructions, including program code (e.g., application code) through communication link 1421 and communication interface 1413. Received program code may be executed by processor 1404 as it is received, and/or stored in memory 1406 or other non-volatile storage for later execution.

In the example shown, system memory 1406 can include various modules that include executable instructions to implement functionalities described herein. System memory 1406 may include an operating system ("O/S") 1432, as well as an application 1436 and/or logic module(s) 1459. In the example shown in FIG. 14, system memory 1406 may include any number of modules 1459, any of which, or one or more portions of which, can be configured to facilitate any one or more components of a computing system (e.g., a client computing system, a server computing system, etc.) by implementing one or more functions described herein.

The structures and/or functions of any of the above-described features can be implemented in software, hardware, firmware, circuitry, or a combination thereof. Note that the structures and constituent elements above, as well as their functionality, may be aggregated with one or more other structures or elements. Alternatively, the elements and their functionality may be subdivided into constituent sub-elements, if any. As software, the above-described techniques may be implemented using various types of programming or formatting languages, frameworks, syntax, applications, protocols, objects, or techniques. In some examples, the described techniques may be implemented as a computer program or application (hereafter "applications") or as a plug-in, module, or sub-component of another application. The described techniques may be implemented as software, hardware, firmware, circuitry, or a combination thereof. If implemented as software, the described techniques may be implemented using various types of programming, development, scripting, or formatting languages, frameworks, syntax, applications, protocols, objects, or techniques, including Python™, ASP, ASP.net, .Net framework, any API architecture, such as REST, etc., Ruby, Ruby on Rails, C, Objective C, C++, C #, Adobe® Integrated Runtime™ (Adobe® AIR™), ActionScript™, Flex™, Lingo™, Java™, JSON, Javascript™, Ajax, Perl, COBOL, Fortran, ADA, Microsoft® .NET, Node.js, XML, MXML, HTML, DHTML, XHTML, HTTP, XMPP, PHP, and others, including SQL™, SPARQL™, Turtle™, etc. The described techniques may be varied and are not limited to the embodiments, examples or descriptions provided.

As hardware and/or firmware, the above-described techniques may be implemented using various types of programming or integrated circuit design languages, including hardware description languages, such as any register transfer language ("RTL") configured to design field-programmable gate arrays ("FPGAs"), application-specific integrated circuits ("ASICs"), or any other type of integrated circuit. According to some embodiments, the term "module" can refer, for example, to an algorithm or a portion thereof, and/or logic implemented in either hardware circuitry or software, or a combination thereof. These can be varied and are not limited to the examples or descriptions provided.

In some embodiments, modules 1459 of FIG. 14, or one or more of their components, or any process or device described herein, can be in communication (e.g., wired or wirelessly) with a mobile device, such as a mobile phone or computing device, or can be disposed therein. In some cases, a mobile device, or any networked computing device (not shown) in communication with one or more modules 1459 or one or more of its/their components (or any process or device described herein), can provide at least some of the structures and/or functions of any of the features described herein. As depicted in the above-described figures, the structures and/or functions of any of the above-described features can be implemented in software, hardware, firmware, circuitry, or any combination thereof. Note that the structures and constituent elements above, as well as their functionality, may be aggregated or combined with one or more other structures or elements. Alternatively, the elements and their functionality may be subdivided into constituent sub-elements, if any. As software, at least some of the above-described techniques may be implemented using various types of programming or formatting languages, frameworks, syntax, applications, protocols, objects, or techniques. For example, at least one of the elements depicted in any of the figures can represent one or more algorithms. Or, at least one of the elements can represent a portion of logic including a portion of hardware configured to provide constituent structures and/or functionalities.

According to some embodiments, the term "circuit" can refer, for example, to any system including a number of components through which current flows to perform one or more functions, the components including discrete and complex components. Examples of discrete components include transistors, resistors, capacitors, inductors, diodes, and the like, and examples of complex components include memory, processors, analog circuits, digital circuits, and the like, including field-programmable gate arrays ("FPGAs"), application-specific integrated circuits ("ASICs"). Therefore, a circuit can include a system of electronic components and logic components (e.g., logic configured to execute instructions, such that a group of executable instructions of an algorithm, for example, and, thus, is a component of a circuit). According to some embodiments, the term "module" can refer, for example, to an algorithm or a portion thereof, and/or logic implemented in either hardware circuitry or software, or a combination thereof (i.e., a module can be implemented as a circuit). In some embodiments, algorithms and/or the memory in which the algorithms are stored are "components" of a circuit. Thus, the term "circuit" can also refer, for example, to a system of components, including algorithms. These can be varied and are not limited to the examples or descriptions provided. Further, none of the above-described implementations are abstract, but rather contribute significantly to improvements to functionalities and the art of computing devices.

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

The invention claimed is:

1. A method comprising:
    identifying data representing each application interface in a subset of application interfaces;
    synthesizing a syntactic data structure for each application interface;
    analyzing the syntactic data structure against other syntactic data structures for other application interfaces to identify duplicative constituent portions among multiple syntactic data structures;
    detecting a portion of multiple application interfaces associated with the duplicative constituent portions;
    substituting data representing a reference to a location into the portion of multiple application interfaces resides; and
    evaluating interoperability of a subset of multiple application interfaces to validate collective operation of the subset of application interfaces.

2. The method of claim 1 wherein identifying data representing each application interface comprises:
    identifying data representing an application programming interface ("API") structure in accordance with a specification.

3. The method of claim 1 further comprising:
    identifying a pattern of a structure of object types and property types for the syntactic data structure.

4. The method of claim 3 wherein analyzing the syntactic data structure against the syntactic data structures comprises:
    comparing the pattern of object types and property types of a first syntactic data structure against another pattern of a second syntactic data structure;
    determining a match between the pattern and the another pattern to form a matched pattern.

5. The method of claim 4 wherein detecting the portion of multiple application interfaces comprises:
    mapping nodes of the matched pattern of the first syntactic data structure and the second syntactic data structure as the duplicative constituent portions to the portion of multiple application interfaces.

6. The method of claim 4 wherein determining the match between the pattern and the another pattern comprises:
    identifying the pattern and the another pattern as candidate duplicate patterns;
    accessing data representing one or more threshold criteria;
    computing a degree of similarity between the candidate duplicate patterns as a function of the one or more threshold criteria; and
    classifying the candidate duplicate patterns as the matched pattern based on the degree of similarity.

7. The method of claim 1 wherein synthesizing the syntactic data structure comprises:
    identifying one or more objects as nodes at a first hierarchical level;
    determining one or more objects as additional nodes at another hierarchical level;
    detecting one or more properties of at least one object; and
    determining object types for the object and property types for the properties.

8. The method of claim 7 further comprising:
    determining at least one application interface description language with which the application interface is formed; and determining object types for the objects and property types for the properties in accordance with the application interface description language.

9. The method of claim 7 further comprising:
synthesizing other syntactic data structures for other application interfaces in the subset of application interfaces.

10. The method of claim 7 wherein synthesizing the syntactic data structure comprises:
synthesizing an abstract syntax tree.

11. The method of claim 1 further comprising:
generating a dictionary of objects for the subset of application interfaces, the dictionary of objects including data representing object types and property types, and data representing associations among the object types and the property types from each of the application interfaces.

12. The method of claim 1 wherein identifying the data representing each application interface in the subset of application interfaces comprises:
receiving data representing a legacy application interface;
monitoring exchanges of data among the legacy application interface and one or more other application interfaces in the subset of application interfaces; and
generating an application interface definition for the legacy application interface to form a replicated application interface.

13. The method of claim 12 wherein the replicated application interface is compliant to an application interface specification and the legacy application interface is non-compliant with respect to the application interface specification.

14. The method of claim 1 wherein evaluating the interoperability comprises:
analyzing statically an application interface that is configured to interoperate in a system of application interfaces including the subset of application interfaces.

15. The method of claim 14 further comprising:
building a topology representing electronic communication paths among the system of application interfaces.

16. The method of claim 1 wherein evaluating the interoperability comprises:
analyzing dynamically an application interface that is configured to interoperate in a system of application interfaces including the subset of application interfaces.

17. The method of claim 16 further comprising:
detecting a request via the reference to another application interface;
diverting the request to logic implementing a design time analyzer; and
simulating a response to the request.

18. The method of claim 1 wherein evaluating the interoperability comprises:
analyzing an application interface at run time, the application interface being configured to interoperate in a system of application interfaces including the subset of application interfaces.

19. An apparatus comprising:
a memory including executable instructions; and
a processor, responsive to executing the instructions, is configured to:
identify data representing each application interface in a subset of application interfaces;
synthesize a syntactic data structure for each application interface;
analyze the syntactic data structure against other syntactic data structures for other application interfaces to identify candidate duplicative constituent portions among multiple syntactic data structures;
detect a portion of multiple application interfaces associated with the candidate duplicative constituent portions;
substitute data representing a reference to a location into the portion of multiple application interfaces resides; and
evaluate interoperability of a subset of multiple application interfaces to validate collective operation of the subset of application interfaces.

20. The apparatus of claim 19 wherein a subset of the instructions to identify data representing each application interface further causes the processor to:
identify data representing an application programming interface ("API") structure in accordance with a specification.

* * * * *